(12) United States Patent
Budd et al.

(10) Patent No.: US 10,658,182 B2
(45) Date of Patent: May 19, 2020

(54) CHIP HANDLING AND ELECTRONIC COMPONENT INTEGRATION

(71) Applicant: International Business Machines Corporation, Armonk, NY (US)

(72) Inventors: Russell A. Budd, North Salem, NY (US); Qianwen Chen, Ossining, NY (US); Bing Dang, Chappaqua, NY (US); Jeffrey D. Gelorme, Burlington, CT (US); Li-wen Hung, Mahopac, NY (US); John U. Knickerbocker, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/551,377

(22) Filed: Aug. 26, 2019

(65) Prior Publication Data
US 2019/0378720 A1   Dec. 12, 2019

Related U.S. Application Data

(60) Continuation of application No. 16/550,261, filed on Aug. 25, 2019, which is a division of application No. (Continued)

(51) Int. Cl.
*H01L 21/20* (2006.01)
*B24B 7/22* (2006.01)
(Continued)

(52) U.S. Cl.
CPC .......... *H01L 21/2007* (2013.01); *B24B 7/228* (2013.01); *H01L 21/6835* (2013.01);
(Continued)

(58) Field of Classification Search
CPC .................. H01L 21/2007; H01L 21/6835
See application file for complete search history.

(56) References Cited

U.S. PATENT DOCUMENTS

| 9,029,238 B2 | 5/2015 | Kndry et al. |
| 10,217,637 B1 | 2/2019 | Budd et al. |

(Continued)

OTHER PUBLICATIONS

Russell A. Budd et al., unpublished U.S. Appl. No. 16/550,261, filed Aug. 25, 2019, Chip Handling and Electronic Component Integration, pp. 1-51 plus 17 sheets of drawings.
(Continued)

*Primary Examiner* — Errol V Fernandes
(74) *Attorney, Agent, or Firm* — Jeffrey Kelly; Otterstedt, Wallace & Kammer, LLP

(57) ABSTRACT

Small size chip handling and electronic component integration are accomplished using handle fixturing to transfer die or other electronic components from a full area array to a targeted array. Area array dicing of a thinned device wafer on a handle wafer/panel may be followed by selective or non-selective de-bonding of targeted die or electronic components from the handle wafer and optional attachment to a carrier such as a transfer head or tape. Alignment fiducials may facilitate precision alignment of the transfer head or tape to the device wafer and subsequently to the targeted array. Alternatively, the dies or other electronic elements are transferred selectively from either a carrier or the device wafer to the targeted array.

20 Claims, 17 Drawing Sheets

Related U.S. Application Data

15/859,608, filed on Dec. 31, 2017, now Pat. No. 10,395,929, which is a continuation of application No. 15/709,876, filed on Sep. 20, 2017, now Pat. No. 10,217,637.

(51) Int. Cl.
  *H01L 21/683* (2006.01)
  *H01L 23/544* (2006.01)
  *H01L 23/498* (2006.01)
  *H01L 21/56* (2006.01)

(52) U.S. Cl.
  CPC .......... *H01L 23/544* (2013.01); *H01L 21/561* (2013.01); *H01L 21/568* (2013.01); *H01L 23/49827* (2013.01); *H01L 2221/6834* (2013.01); *H01L 2221/68309* (2013.01); *H01L 2221/68318* (2013.01); *H01L 2221/68322* (2013.01); *H01L 2221/68327* (2013.01); *H01L 2221/68363* (2013.01); *H01L 2223/5442* (2013.01); *H01L 2223/54426* (2013.01)

(56) References Cited

U.S. PATENT DOCUMENTS

| | | |
|---|---|---|
| 10,395,929 B2 | 8/2019 | Budd et al. |
| 2009/0217517 A1 | 9/2009 | Pique et al. |
| 2013/0149817 A1 | 6/2013 | Jeon et al. |
| 2014/0339672 A1 | 11/2014 | Yano |
| 2015/0035173 A1 | 2/2015 | Dang et al. |
| 2015/0108038 A1 | 4/2015 | Hsu et al. |
| 2015/0318210 A1 | 11/2015 | Budd et al. |
| 2015/0364375 A1 | 12/2015 | Nakamura et al. |
| 2016/0133486 A1 | 5/2016 | Andry et al. |
| 2016/0133497 A1 | 5/2016 | Kndry et al. |
| 2018/0261582 A1 | 9/2018 | Henry et al. |

OTHER PUBLICATIONS

Paul J. Otterstedt, List of IBM Patents or Patent Applications Treated as Related, Sep. 12, 2019, pp. 1-2.

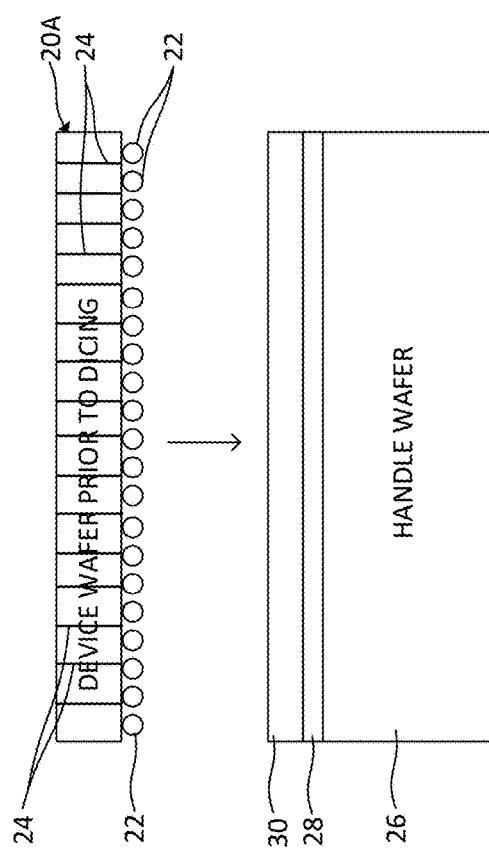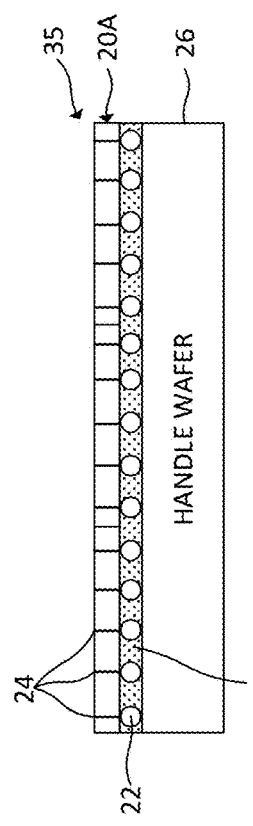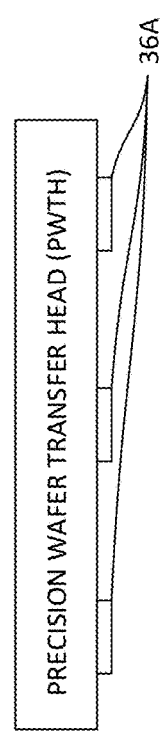
FIG. 1
FIG. 2
FIG. 3

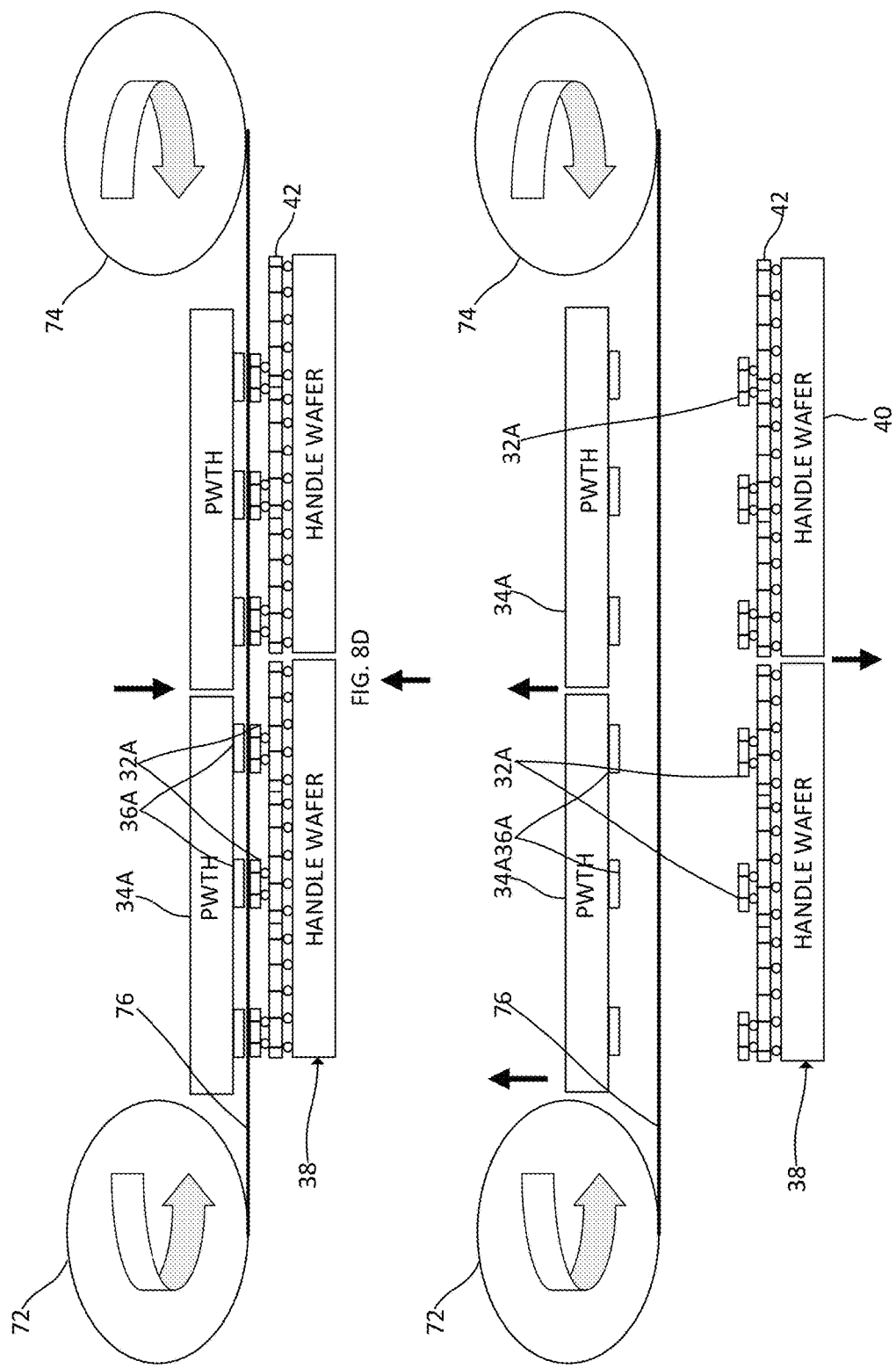

CHIP HANDLING AND ELECTRONIC COMPONENT INTEGRATION

CROSS-REFERENCE TO RELATED APPLICATIONS

This application is a continuation of U.S. patent application Ser. No. 16/550,261 filed Aug. 25, 2019, which is in turn a divisional of U.S. patent application Ser. No. 15/859,608 filed Dec. 31, 2017, which is in turn a continuation of U.S. patent application Ser. No. 15/709,876 filed Sep. 20, 2017, the complete disclosures of all three of which are expressly incorporated herein by reference in their entireties for all purposes.

BACKGROUND

The present disclosure relates to the electrical, electronic, and computer arts, and, more particularly, to the handling of small die and electronic components used to fabricate electronic devices.

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Miniaturization has provided benefits to mobile devices such as smart phones, implantable devices, IoT (internet of things) devices, as well as other applications. As the size of circuit components and electronic devices decreases, challenges arise in the assembly of such components.

Temporary wafer bonding/debonding is an important technology for implementing the fabrication of semiconductor devices, photovoltaic devices, and electrical devices of micron and nanoscale. Bonding may include attaching a device wafer, which is to become a layer in a final electronic device structure, to a substrate or handling wafer so that it can be processed, for example, with wiring, pads, and/or joining metallurgy. Debonding may involve removing the processed device wafer from the substrate or handling wafer so that the processed device wafer may be employed within an electronic device.

Various ways of transporting and assembling electronic components have been developed. In the fabrication of semiconductor chips, semiconductor wafers are divided into individual dies. In forming integrated circuits, identical dies are typically fabricated in a repeated pattern on a surface of a semiconductor wafer. Each die includes electronic structures and/or circuits. The individual dies are cut or diced from the wafer, then packaged as an integrated circuit. Wafer dicing involves sawing a wafer comprising electronic components such as MOSFETs or memory devices into individual dies. Before dicing, some wafers may go through a thinning steps such as with back grinding process to thin them down from 780 μm thickness (for 300 mm diameter wafers) or from 730 μm thickness (for 200 mm diameter wafers) to, for example, about 50 μm to 150 μm for very thinned wafers or with wafer thickness up to 600 μm thickness or no thinning for full thickness wafers which is common at 780 μm or 730 μm thickness. Tape is applied to the wafer. Sticky tape allows for safe removal of each die during a subsequent push-up step in the pick-and-place operation. A blade or laser is used to cut the wafer into individual dies without cutting through the tape. The individual dies accordingly remain attached to the tape after the dicing process. Various types of wafer tapes have been utilized in semiconductor processing, such as for dicing processes. UV curable tapes are among those that have been employed. Known good dies (KGDs) are dies that have been electronically tested before being placed in a carrier. A typical KGD is a result of a tested wafer that has been diced.

A pick and place tool may be used to separate the individual dies from the wafer tape. Pick and place tools operate by lifting an individual die from the wafer tape and placing the die onto a package, substrate, wafer or other dies. Eject pin(s) push up through the tape to dislodge a die therefrom. A vacuum collet then lifts the die from the tape and places it into a final package. Positioning (XY) and centering is performed automatically or semi-automatically. Carriers other than tapes have also been developed for storing and transporting singulated devices. After pick and place, (1) the die with area array solder bumps typically go through a solder reflow furnace to electrically connect the die to the package, or (2) the pick and place tool or subsequent multi-die holder (such as a gel pack) may use a thermal compression bonding head for pick and place from a die holder and then apply heat and pressure for bonding, or (3) a wire-bond attach die may be positioned with adhesive and then electrically joined with metal wires between one or more wirebond pads on the die to wirebond pads on a package or other die.

SUMMARY

Embodiments of the present disclosure provide techniques for transferring singulated electronic elements such as semiconductor dies from a wafer to an electronic assembly.

In accordance with one exemplary embodiment, a first method for integrating electronic elements into an electronic package assembly includes obtaining a semiconductor structure including a device wafer comprising an array of singulated electronic elements, a handle wafer, and a release layer. The device wafer of the semiconductor structure is bonded to the handle wafer and the release layer is positioned between the device wafer and the handle wafer. The first method further includes aligning a carrier with the device wafer and directing electromagnetic radiation through the handle wafer, thereby causing ablation of discrete, selected portions of the release layer beneath a targeted plurality of the singulated electronic elements. The targeted plurality of singulated electronic elements are attached to the carrier, aligned with a plurality of targeted bonding sites of an electronic package assembly, integrated into the electronic package assembly at the targeted bonding sites, and detached from the carrier.

Direct transfer of electronic elements from a device wafer to an electronic package assembly is provided in a first alternative method, which includes obtaining a semiconductor structure including a device wafer comprising an array of singulated electronic elements, a handle wafer, and a release layer, the device wafer being bonded to the handle wafer, and the release layer being positioned between the device wafer and the handle wafer. The semiconductor structure is aligned with an electronic package assembly such that a targeted plurality of the singulated electronic elements are aligned with a plurality of targeted bonding sites of the electronic package assembly. The method further includes causing the semiconductor structure to contact the electronic package assembly and directing electromagnetic radiation through the handle wafer following contact of the semiconductor structure with the electronic package assembly, thereby causing ablation of discrete, selected portions of the release layer beneath the targeted plurality of the singulated electronic elements. The targeted plurality of singulated electronic elements is bonded to the targeted bonding sites of the electronic package assembly.

A second alternative method for integrating electronic elements into an electronic package assembly includes obtaining a carrier including a handle and a release layer on a first surface of the handle and attaching a plurality of singulated electronic elements to the carrier such that the release layer is between the electronic elements and the first surface of the handle. The carrier is aligned with an electronic package assembly including bonding sites thereon and electromagnetic radiation is directed through the handle, thereby causing ablation of discrete, selected portions of the release layer beneath a first targeted plurality of the singulated electronic elements attached to the carrier. The method further includes integrating the first targeted plurality of the singulated electronic elements into the electronic package assembly at a targeted plurality of the bonding sites.

An assembly for integrating electronic elements into an electronic package assembly includes a semiconductor structure including a device wafer comprising an array of singulated electronic elements, the singulated electronic elements including a plurality of targeted electronic elements, a handle wafer bonded to the device wafer, one or more first alignment markers, the targeted electronic elements being located at selected distances from the one or more first alignment markers, and a release layer positioned between the device wafer and the handle wafer. The assembly further includes a carrier assembly. The carrier assembly includes one or more second alignment markers and selected surface areas configured for attaching the targeted electronic elements and for alignment with the targeted electronic elements when the one or more first alignment markers are aligned with the one or more second alignment markers. An electromagnetic radiation source is configured to direct electromagnetic radiation through the handle wafer. At least one of the electromagnetic radiation source and the handle wafer is configured to allow ablation of discrete, selected portions of the release layer beneath and corresponding to the targeted plurality of the singulated electronic elements using the electromagnetic radiation source. An electronic package assembly includes one or more third alignment markers and a plurality of targeted bonding sites. The selected surface areas of the carrier assembly are configured for alignment with the targeted bonding sites when the one or more second alignment markers are aligned with the one or more third alignment markers.

An alternative assembly for integrating electronic elements into an electronic package assembly includes a semiconductor structure including a device wafer comprising an array of singulated electronic elements, the singulated electronic elements including a plurality of targeted electronic elements, a handle wafer bonded to the device wafer and including one or more first alignment markers, the targeted electronic elements being located at selected distances from the one or more first alignment markers, and a release layer positioned between the device wafer and the handle wafer. An electromagnetic radiation source is configured to direct electromagnetic radiation through the handle wafer. At least one of the electromagnetic radiation source and the handle wafer is configured to allow ablation of discrete, selected portions of the release layer beneath and corresponding to the targeted plurality of the singulated electronic elements using the electromagnetic radiation source. An electronic package assembly includes one or more second alignment markers and a plurality of targeted bonding sites, the targeted bonding sites being configured for alignment with the targeted electronic elements when the one or more first alignment markers are aligned with the one or more second alignment markers.

Techniques and assemblies as disclosed herein can provide substantial beneficial technical effects. By way of example only and without limitation, one or more embodiments may provide one or more of the following advantages:
  Allows handling of small, thin dies without damage and in a cost efficient manner;
  Allows handling of small sensors without damage and in cost efficient manner;
  Allows handling of sub-components and components without damage and in a cost efficient manner;
  Facilitates fabrication of low, prototype-level quantities up through high volume manufacturing level throughput;
  Compatible with pick and place technology;
  Compatible with bonding and laser debonding technology;
  Compatible with precision components and wafer level integration and/or fixture level integration of one to five microns tolerance or less;
  Compatible with wafer, panel and/or roll to roll level integration and/or combinations of these integration methods;
  Compatible with silicon, glass, sapphire, composite material, polymer handle structures.

BRIEF DESCRIPTION OF THE DRAWINGS

These and other features, aspects, and advantages of the present invention will become better understood with regard to the following description, appended claims, and accompanying drawings where:

FIG. 1 schematically illustrates the assembly of a device wafer and a handle wafer;

FIG. 2 is a sectional view schematically illustrating the device wafer assembled to the handle wafer following thinning of the electronic elements on the handle wafer;

FIG. 3 is a sectional view schematically illustrating a precision wafer transfer head including raised areas;

FIG. 8D is a schematical illustration showing the transfer of dies from the tape to an electronic package assembly using the precision wafer transfer head;

FIG. 8E is a schematical illustration showing the transferred dies on the electronic package assembly;

In the sectional views included herein, features present behind the sectional planes are not shown to reduce clutter and enhance clarity.

DETAILED DESCRIPTION

The subject matter of the instant application will be described with reference to illustrative embodiments. For this reason, numerous modifications can be made to these embodiments and the results will still come within the scope of the invention. No limitations with respect to the specific embodiments described herein are intended or should be inferred.

As the term is used herein and in the appended claims, "about" means within plus or minus twenty percent.

Figure 9:
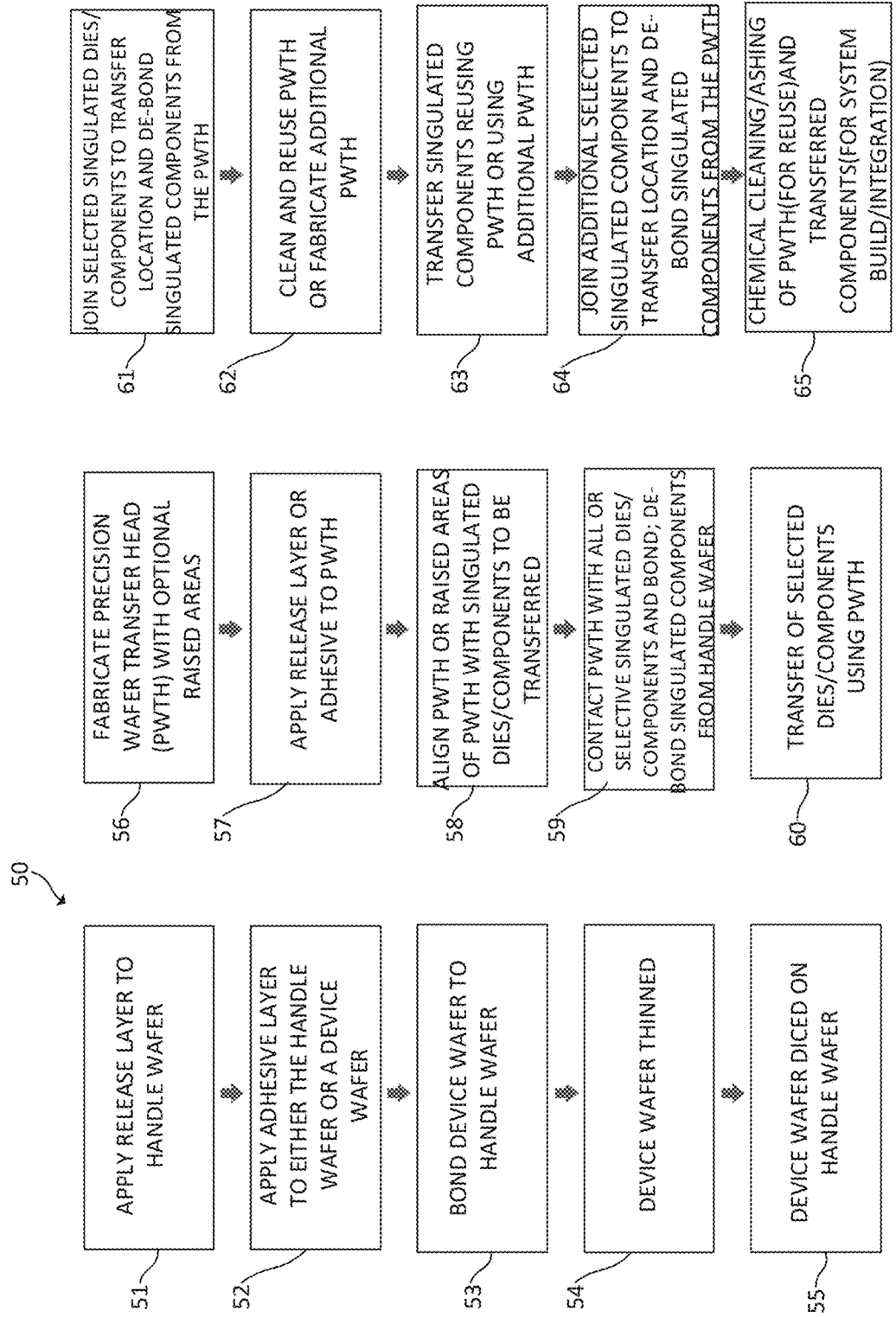
FIG. 9 is a flow diagram showing exemplary steps for integrating dies and components on an electronic package assembly.

FIG. 9 shows a flow diagram of a method 50 that includes forming singulated electronic structures and transferring the singulated structures in accordance with a first illustrative embodiment. The method is employed as part of a fabrication process for producing electronic devices including small dies and/or electronic components, for example smart phones, wearable electronic devices, smart tags for identifying merchandise, and IoT devices. The method 50 and other methods described herein allow handling of sub-components and components without damage and in a cost efficient manner, including for example batteries, antennas, capacitors, super-capacitors, optics, photonics, transmit and/or receive communications elements, memory devices, light emitting diodes, energy scavenging devices, hermetic sealing packages or structures, and other electronic elements. The methods described and the disclosed assemblies facilitate transfer of dies or electronic components from a full area array to a targeted array. FIGS. 1-6 show sectional views of exemplary structures and steps as employed during the fabrication process 50.

As schematically illustrated in FIG. 1 a device wafer 20A including active circuits is provided. The device wafer may or may not include a ball grid array comprising solder bumps 22 and vertical, electrically conductive vias 24 connected to integrated circuit elements, as shown in the figure. The device wafer can, in some embodiments, be fabricated using conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, James D. Plummer et al., Silicon VLSI Technology: Fundamentals, Practice, and Modeling 1st Edition, Prentice Hall, 20AA01; S. Wolf and R. N. Tauber, Silicon Processing for the VLSI Era, Volume 1, Lattice Press, 1986; S. Wolf, Silicon Processing for the VLSI Era, Vol. 4: Deep-Submicron Process Technology, Lattice Press, 20AA03; and S. M. Sze, VLSI Technology, Second Edition, McGraw-Hill, 1988, all of which are incorporated by reference herein. Structural and functional aspects of MOSFETs and FinFETs are described in J. G. Fossum et al., Fundamentals of Ultra-Thin-Body MOSFETs and FinFETs, Cambridge University Press, 20AA13, which is also hereby incorporated by reference herein. It will be further appreciated that the methods disclosed herein may also be applicable to the processing of device wafers obtained using fabrication methods and tooling that may be developed in the future.

Referring again to FIG. 1, a silicon or glass handle wafer 26 is provided. The handle wafer may alternatively be formed from sapphire or organic materials such as but not limited to polydimethylsiloxane (PDMS), polyimide (PI), benzocyclobutene (BCB) material or any other handle material that can hold die, components, sensors, sub-components, optical elements or thin sensors that can be "printed", transferred or deposited following release with a laser debonding method. The handle wafer facilitates using laser debonding technology in very controlled manner as described below. The handle wafer 26 and the device wafer 20A may have the same dimensions. Both wafers 20A, 26 may be round and have standard or non-standard diameters. In some embodiments, the handle wafer is made from Borofloat glass, a chemically resistant borosilicate glass having high transparency in the near IR and UV range. The thickness of a glass or silicon "handle wafer" is typically about 600 µm to 780 µm for compatibility of robots and semiconductor process equipment such as 300 mm or 200 mm wafers. The handle wafer 26 may be further thinned or may be thicker than the typical thicknesses and/or may have a diameter other than 300 mm and 200 mm. Alternate "handle fixtures" may include a large glass panel or alternate compatible material of X length and Y width and Z thickness or smaller size of glass or silicon of X length, Y width and Z thickness or alternate materials for some applications. The term "handle wafer" as employed herein also encompasses such fixtures. The use of a handle wafer such as but not limited to glass and/or silicon "handle wafers" permit the creation of thinned device wafers and/or die, components, sub-components, and packages for electronics precision placement, assembly, integration, bonding and small quantity to mass quantity electronic micro-system creation. The handle wafers with die, components, sub-components and/or packages (electronic elements) can then be used to both thin or handle these electronics or sub-systems and singulate these electronics or sub-systems using reactive ion etching, laser dicing and/or wafer saw sizing/dicing techniques, thereby forming a plurality of singulated electronic elements. The thickness of glass panels, if employed, can be consistent with standards and industry use of large panel glass. The thickness of polymer handle layers or glass such as for roll to roll processing component or sub-component release can be in the range 25 µm to 200 µm thickness, though such range is not considered critical.

A release layer 28 and a distinct adhesive layer 30 are sequentially deposited on the handle wafer 26 in some embodiments, as shown in the figure. Alternatively, the adhesive layer 30 is deposited on the device wafer 20A while the release layer is deposited on the handle wafer 26. These steps are identified as steps 51 and 52 in FIG. 9. Distinct release and adhesive layers provide advantages in controlling the device wafer release to a thin release layer less than 500 nm in some embodiments. Distinct release and adhesive layers further allow the choice of adhesive to control temperature and cure conditions such as but not limited to low-temperature bonding and curing. A single (monolithic) release layer/adhesive layer can alternatively be deployed and has the advantage of a single layer of deposition for release and adhesion.

The adhesive layer 30 is a phenoxy adhesive or other low temperature adhesive in some exemplary embodiments. A phenoxy resin can be spun on either the release layer 28 or the device wafer 20A followed by thermal baking. As used herein, the term "phenoxy resin" denotes a family of bisphenol A/epichlorohydrin linear polymers. Phenoxy resins are typically tough and ductile thermoplastic materials having high cohesive strength and good impact resistance. The backbone ether linkages and pendant hydroxyl groups promote wetting and bonding to polar substrates. Structurally, in some examples, the phenoxy resin may be polyhydroxyether having terminal alpha-glycol groups. In some embodiments, weight-average molecular weights for the phenoxy resins in accordance with the present disclosure may range from approximately 25,000 to above 60,000. The highest polymeric species of phenoxy resin may exceed 250,000 daltons; olydispersity is very narrow, typically less than 4.0. An average molecule contains forty or more regularly spaced hydroxyl groups. The phenoxy resin may be a thermoplastic resin suitable for use as an adhesive in low temperature, e.g., less than 300° C., wafer bonding and/or laser debonding applications. In one example, the adhesive layer may be a phenoxy resin having the chemical name: polyoxy(2-hydrozy-1,3-propanediyl)oxy-1,4-phenylene(1-methylethylidene)-1,4-phenylene. Phenoxy adhesives and other adhesives used for chip and wafer stacking purposes are known to the art and may continue to be developed.

The release layer 28 may be formed of a composition that facilitates de-bonding of the handle and device wafers by ablation using a laser, for example a UV laser operating at 355 nm. It will be appreciated that the electromagnetic radiation used for ablating the release layer should be at a wavelength compatible with at least partial transmission through the handle wafer 26 or fixture to which the device wafer 20A is bonded. Electromagnetic radiation within about the ultraviolet to optical light ranges, namely from about 200 nm to 1,000 nm, may be employed in some embodiments. Exemplary wavelengths of about 266 nm 308 nm, 355 nm and 532 nm may allow solid state lasers be utilized for power and cost efficiency and with various laser scanning methods including, for example, spot size scanning, filtered or top hat scanning, or line beam scanning. Laser frequency options include but are not limited to micro-second, nano-second, femto-second or pico second laser systems. For glass handle wafers, the preferred wavelength for ablating the release layer is 355 nm. For silicon handle wafers the preferred wavelength is 1064 nm to 2800 nm. For polymer handle wafers, the preferred wavelength is dependent upon the transmission properties of the polymer and proper selection of absorbing release layer. The wavelength for laser release of the radiation-absorbing release layer or combined release layer/adhesive layer should be tailored for compatibility of the application for high transmission through the handle and high absorption in the release layer. The release layer, the adhesive layer and handle wafer, panel, or roll to roll handle sheet should be compatible with processing the die, components or subcomponents through subsequent processes, chemicals, temperatures and cleaning. The adhesive layer 30 may be chosen regardless of its UV-absorbing properties. In some embodiments, the release layer 28 has intrinsic UV-absorbing properties. As known in the art, some commercially available organic planarizing layers (OPLs) and organic dielectric layers (ODLs) have such properties as do some commercially available adhesives. In other embodiments, a dye is incorporated within the polymeric material comprising the release (ablation) layer to impart the desired UV-absorbing properties. Exemplary dyes that can be employed in one or more embodiments include 9-anthracenecarboxylic acid and benzanthrone added at a weight percentage of at least ten percent to any non-absorbing material capable of forming a film from solution such as polymethylmethacrylate (PMMA). Some exemplary ODL materials are spin applied to glass and cured in a nitrogen environment at 350° C. for approximately one hour to produce a film. Such a film may be optically transparent throughout the visible spectrum, but strongly sensitive to decomposition in the UV wavelength range below about 360 nm, and may be fully and cleanly ablated using common UV laser sources such as an excimer laser operating at 308 nm (e.g. XeCl) or 351 nm (e.g. XeF) or a diode-pumped Nd:YAG laser operating at 355 nm. Laser debonding of a semiconductor wafer from a glass handler using an ablation layer is known to the art. U.S. Pat. No. 9,029,238, which is incorporated by reference herein, discloses exemplary adhesives, ablation layers and laser scanning techniques that may be employed for the laser de-bonding of glass handlers from device wafers. Curing of the deposited adhesive and release layers can be effected using known techniques such as UV and X-ray curing. The use of X-ray absorbing or UV absorbing additives permits low temperature curing and subsequent debonding release with laser debonding.

It will be appreciated that materials other than those specifically identified herein can possibly be employed to form the release layer and the adhesive layer. The release layer can, for example, be formed from a material that is highly absorbent in the infrared range, allowing for infrared ablation rather than UV ablation later in the process. Infrared radiation having wavelengths from about 1,000 nm to 10,000 nm may be employed with respect to some release layers. A release layer for IR compatibility may be a high-carbon containing layer, high-aluminum containing layer or alternate layer with higher IR absorption. Wavelengths of about 1064 nm, about 1800 nm or higher wavelength lasers may allow solid state lasers to be utilized for power and cost efficiency. Wavelengths of about 266 nm, 308 nm, 355 nm and 532 nm can, for example, be employed in embodiments including glass handle wafers or fixtures and 1064 nm and about 1800 to 2800 nm wavelengths for embodiments including silicon handle wafers or fixtures. Again, a variety of beam shapes, scanning systems and a variety of pulse lengths and power levels may be utilized, with lower power preferred to avoid possible damage to electronic elements. The adhesive layer deposited on the release layer can, for example, be an acrylate or a polyimide-based adhesive. Such adhesives are commercially available for use in the fabrication of semiconductor devices. If a mid-temperature phenoxy-based or acrylate adhesive is employed, bonding temperature may be in the range of 150–300° C.

High temperature adhesives, some of which comprise polyimide, have bonding temperatures between about 250-400° C. HD-3007, available from HD Microsystems, Inc., is an exemplary polyimide-based material that may be spin-applied as a release layer and cured at 350° C. It strongly absorbs light in the UV spectrum and may be easily ablated by radiation from a 308 nm excimer laser. HD-3007 has been used as a temporary adhesive bonding wafers to carrier wafers for backgrinding and other processes. Debonding has been demonstrated with laser, solvent and thermal release methods. Residual HD-3007 can be removed using a dry etch or solvent process. The selection of adhesive depends, in part, on the temperature at which further processing steps may be conducted.

The device wafer 20A is bonded to the aligned handle wafer 26 in step 53 (FIG. 9), as schematically illustrated in FIG. 1. The bonding includes physically contacting the device wafer and the handle wafer under controlled heat and pressure in a vacuum environment. The temperature and pressure are consistent with the selected adhesive, which may be about room temperature to 150° C. and pressure between 0.1 and 20 psi in some embodiments. The employment of a vacuum environment may help to avoid bubbles or voids in the adhesive layer 30. Commercial bonding tools may be employed during this step. Bonding parameters will, of course, differ depending on the choice of adhesive material as discussed above. The device wafer 20A and the handle wafer 26 have the same diameters in some embodiments.

Following the bonding of the device wafer to the handle wafer, the device wafer 20A is thinned in step 54 (FIG. 9) to obtain a structure 35 as shown in FIG. 2. Wafer thinning reduces the thickness of the device or electronic components wafer (20A, 20B, and/or 20C) to one hundred microns (100 μm) or less in some embodiments. The bonded pair of the handle wafer 26 and the device or electronics components wafers 20A, 20B, 20C permit the device and electronic components wafers to be thinned and singulated even while still attached to the handle wafer or fixture. In some embodiments, device or electronic components wafer thickness is reduced to fifty microns or less. Wafer thinning can be performed with a coarse grind followed by a fine grind and then polishing. Wafer edge trimming may also be conducted. In one or more embodiments, the device wafer 20A is bonded to the handle wafer 26 and then goes through coarse grind, fine grind and polish. Alternately a thinned device or electronic components wafer can be created by spalling technology and subsequent attachment to a handle wafer. Exemplary controlled spalling technology for forming device wafers is disclosed in U.S. Pat. No. 8,841,203, which is incorporated by reference herein. While the term "device wafer" is used in describing a wafer comprising dies in the exemplary embodiments, it may in fact include electronic elements other than dies, including electronic components as discussed with respect to the "components wafer" 20C.

Figure 4A:
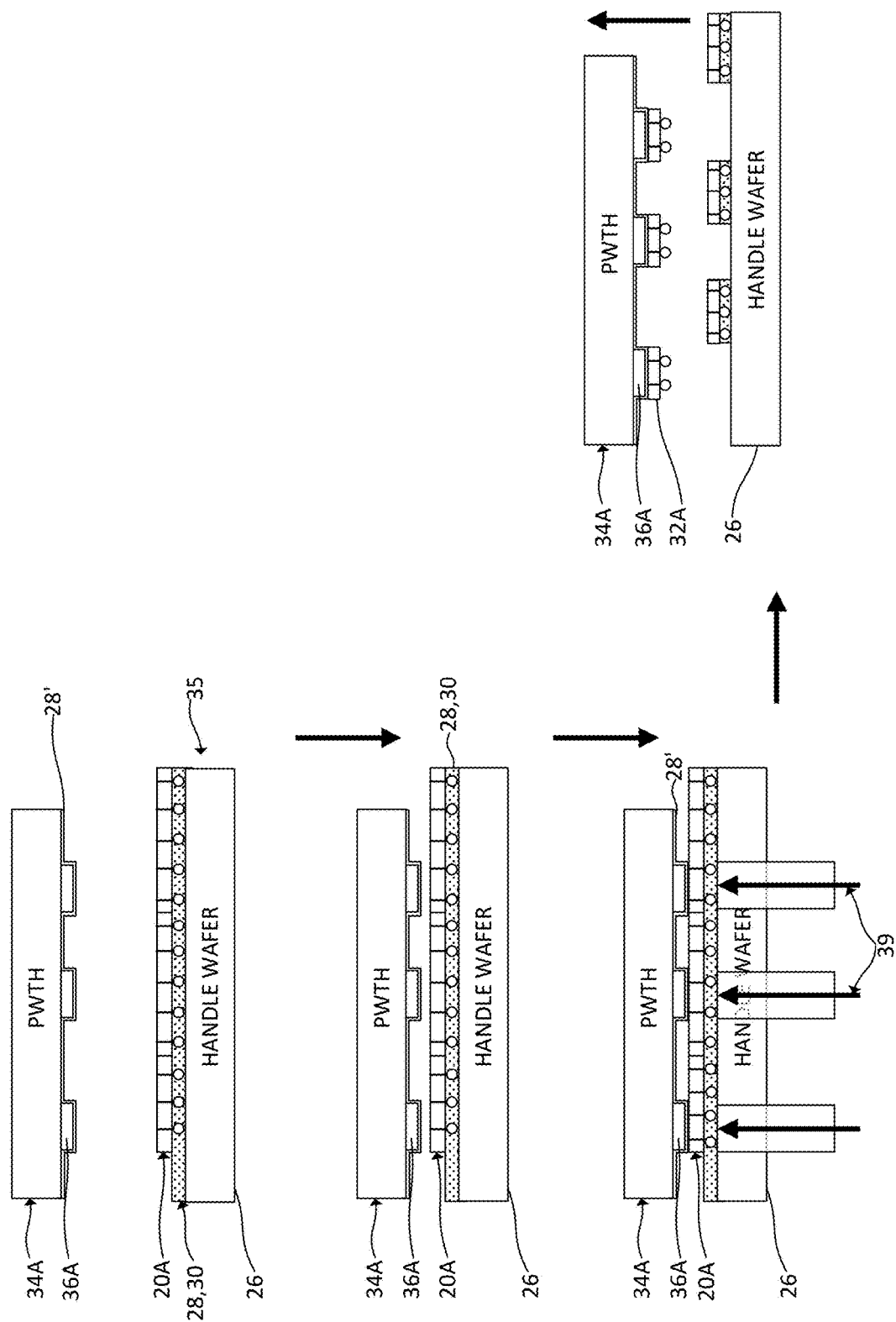
FIG. 4A schematically illustrates the selection of a first set of dies from a device wafer using a precision wafer transfer head.

The thinned device wafer 20A is diced on the handle wafer 26 in step 55 (FIG. 9) to obtain singulated electronic dies 32A as shown in FIG. 4A or other electronic structures. An exemplary wafer dicing process includes spinning on a photoresist layer (not shown) and baking/curing the layer. The photoresist is exposed during lithography. The exposed portions of the photoresist are stripped to exposed the dicing channel areas of the device wafer 20A to be etched. The structure is then cleaned and dried. A reactive ion etch (ME) or deep reactive ion etch (DRIE) or combinations of ME, DRIE and/or laser singulation singulates the wafer 20A into dies. Other types of wafers can be diced into other electronic elements such as 2.5D packages or singulated electronic components. The singulated dies, components and packages can later be integrated into a system or sub-system, as discussed below. As known in the art, singulation can alternatively include saw sizing or laser dicing. The portions of the release layer 28 and the adhesive layer 30 between the singulated dies are also preferably removed using, for example, a timed chemical etch process. Such removal may further include partial undercutting of the release and adhesive layers beneath each die. Complete removal of release layer and adhesive layer material between singulated dies is obtained in some embodiments. In embodiments including a monolithic release layer/adhesive layer, the portions of the monolithic layer between singulated dies can likewise be removed by chemical etching, oxygen plasma etch and/or other etch techniques to form spaces in the release layer/adhesive layer between singulated dies or other electronic elements while still permitting adhesive under the die or other electronic elements to remain attached to the handle wafer.

In a relatively simple approach, selected electronic elements (e.g. die 32A, 32B or components 45) may be transferred directly from a planar glass or silicon handle wafer, transfer head or alternative handle fixture where the end sub-system or system permits such use of a planar handle wafer without interference therefrom. The use of a laser for "controlled debond" or "controlled release" of one or preferably multiple electronic elements from the handle wafer is described further below. Alternatively, one or preferably multiple electronic elements may be transferred from one planar handle wafer or fixture to another either planar or non-planar handle wafer or fixture for purposes of opposite side processing or transfer handling or flipping the die/electronic elements. In some embodiments, selected electronic elements are attached to a carrier such as a precision handle wafer transfer head (PWTH) or functionally similar fixture that may have raised surfaces or depressed regions to facilitate assembly of the selected electronic elements into micro-systems efficiently.

Figure 8A:
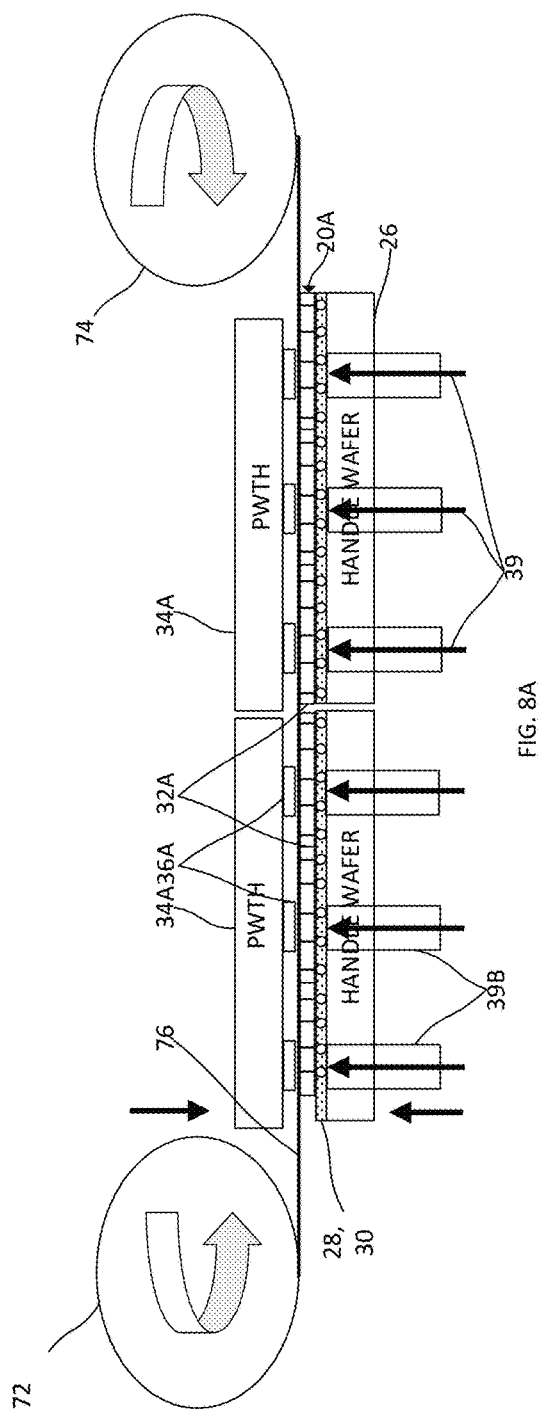
FIG. 8A is a schematical illustration showing the selective transfer of dies from a device wafer to a tape.
Figure 8C:
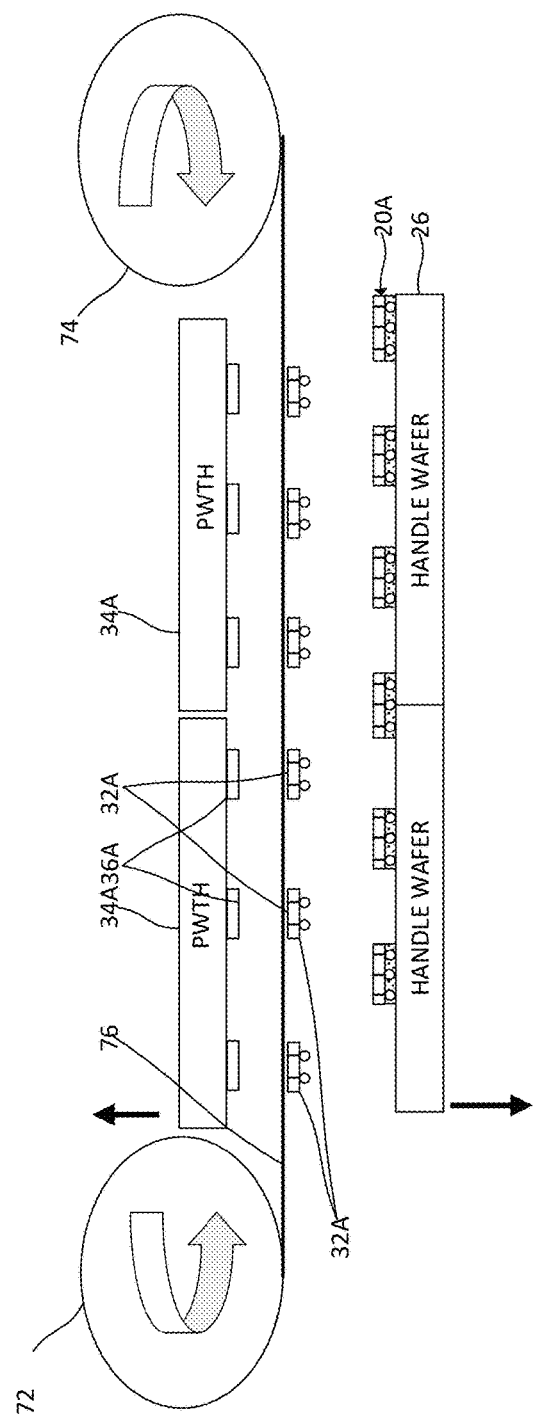
FIG. 8C is a schematical illustration showing the alignment of a precision wafer transfer head to the device wafer using alignment fiducials.
Figure 8B:
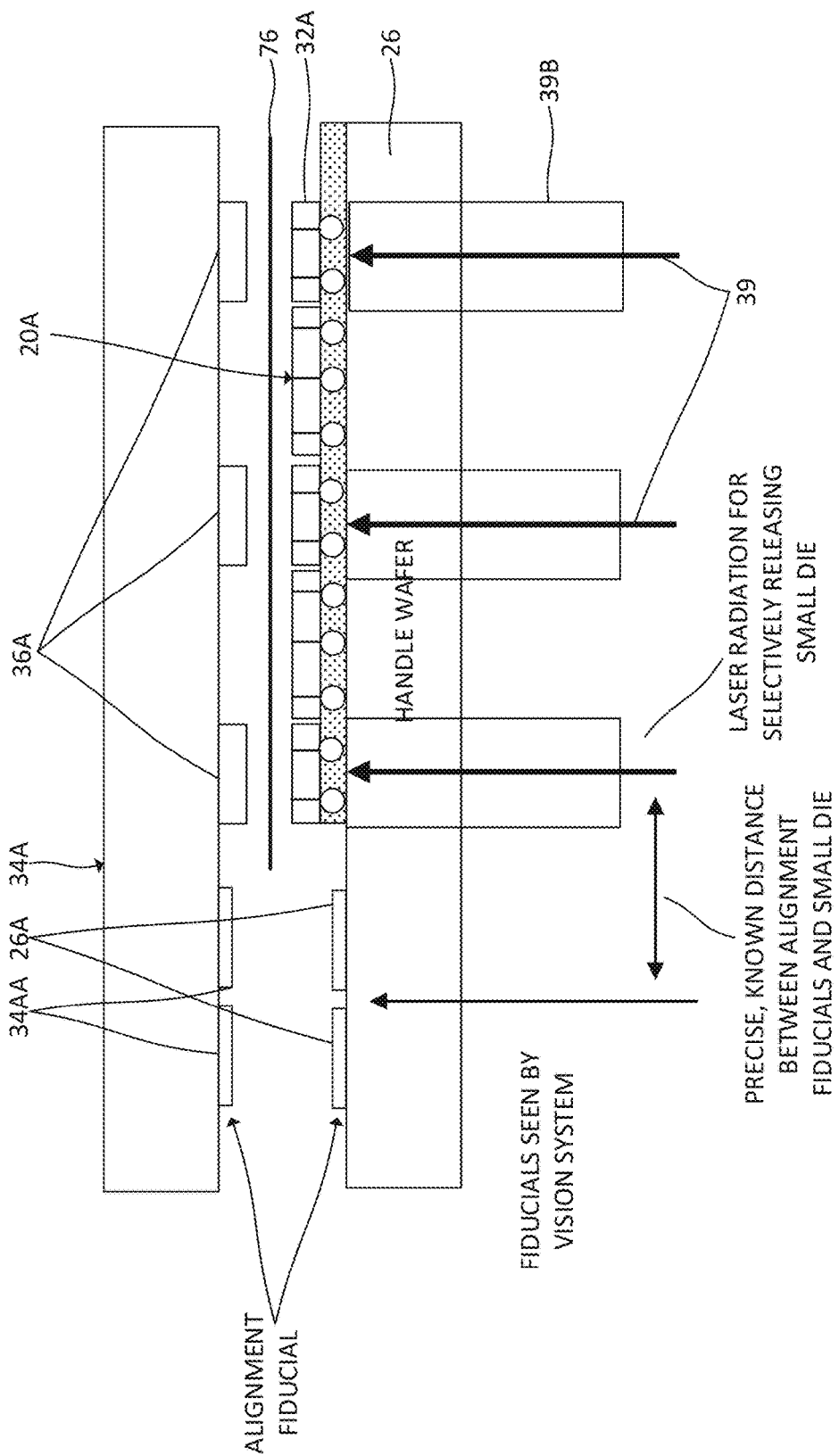
FIG. 8B is a schematical illustration showing the selected dies attached to the tape following laser release from the device wafer.

In one exemplary embodiment, a precision wafer transfer head 34A including a plurality of discrete raised regions 36A is fabricated and utilized to permit assembly and/or bonding of the electronic elements (e.g. die 32A) to an integrating package or sub-system (e.g. electronic package assembly 38) that may have different planarity, height or be multi-component. The precision wafer transfer head (PWTH) 34A is fabricated in step 56 (FIG. 9) to obtain a structure as schematically illustrated in FIG. 3. The PWTH has the same diameter as the diameter of the device wafer 20A in some embodiments, though the same diameter or wafer configuration is not required. A photoresist layer (not shown) is spun on a substantially rigid silicon or glass wafer followed by baking/curing. The resist is patterned using lithographical techniques familiar to those of skill in the art followed by resist removal from the exposed regions thereof and cleaning of the resulting structure. Wafer etching is conducted using RIE, DRIE, a xenon difluoride ($XeF_2$) etch, or other suitable etch process to form recesses within the exposed regions of the wafer. The unetched regions will accordingly form raised areas 36A that extend from the body portion of the wafer. The raised areas 36A are configured for alignment with targeted bonding sites of a target substrate and are used to attach singulated electronic structures of a device wafer, such as the device wafer 20A discussed above, to the transfer head 34A. The remaining portions of the resist are removed and the structure is cleaned. The PWTH 34A can alternatively be formed by growing the raised areas on the wafer or by precision placement and bonding of preformed elements on the wafer that will function as discrete raised areas corresponding to the bonding sites of the target substrate such as a package assembly. The discrete raised areas are also configured for alignment to and bonding with targeted dies or other singulated elements of a device wafer. The surfaces of the raised areas 36A have the same dimensions as the dies 32A they are intended to transfer in some embodiments, but can be smaller than the die dimensions. For example, a raised area 36A having surface dimensions of 500 µm by 500 µm may be used for transferring a die of 500 µm by 500 µm. The device wafer 20A/handle wafer 26 assembly comprising the semiconductor structure 35 and the transfer head 34A may each include a "fiducial marker" to facilitate proper alignment of these structures using optical readers. FIG. 8B, which is discussed further below, shows an exemplary arrangement in which the fiducial markers are on the transfer head 34A and handle wafer 26, respectively. In some preferred embodiments, the precision wafer transfer head is further configured to transfer mass quantities of targeted electronic elements from a full array of such elements to an electronic system or sub-system.

In step 57 (FIG. 9), a thin release layer and/or adhesive 28' is spun on one of the PWTH 34A or the exposed top surface of the device wafer 20A. Alternatively, the release layer and/or adhesive layer can be applied by spraying or using a stamp pad/transfer method. The release and/or adhesive layer applied in this step may be selected from the same material(s) identified for the bonding of the device wafer 20A and the handle wafer 26 as described above. Materials having different electromagnetic absorption properties may be preferred for the release layers 28, 28' such that ablation of the release layer 28 between the handle wafer and device wafer upon being subjected to electromagnetic radiation of a selected wavelength does not also ablate the release layer 28' between the PWTH 34A and the targeted die on the device wafer 20A.

Referring to FIG. 4A, the raised areas 36A of the PWTH 34A are aligned in step 58 (FIG. 9) with an array of singulated dies 32A of the device wafer 20A. Precision alignment can utilize alignment marks (fiducial markers) made on the device wafers 20A, 20B (e.g. element 21A in FIG. 4C) and electronic elements wafers 20C or the handle wafers associated therewith. Any suitable wafer alignment process that allows the attachment of selected die to the PWTH 34A can be employed. (FIG. 8C schematically illustrates one suitable alignment system including alignment fiducials for aligning the PWTH 34A to the handle wafer 26.) One of the opposing surfaces of the PWTH 34A and the device wafer includes a release and/or adhesive layer 28' as discussed above. In step 59, the raised, adhesive-coated surfaces of the raised areas 36A of the PWTH 34A are brought into contact with the targeted dies 32A or the adhesive layer thereon. joining the targeted dies 32A to the PWTH 34A as a force is exerted on at least one of the opposing structures PWTH. Temperature is maintained in a range that facilitates bonding of the targeted dies 32A to the PWTH 34A. The temperature range is selected based on the adhesive and/or release layer applied. In some embodiments, the precision wafer transfer head contacts all of the dies or other elements comprising the device wafer. The formation of raised areas on the PWTH for allowing selective die contact is optional and can be omitted in some embodiments.

In an embodiment wherein the adhesive is applied to the top surface of the device wafer 20A of a structure, such as the structure 35 shown in FIG. 2, the adhesive bonds to most or all of the singulated die 32A comprising the device wafer. In embodiments of the method that employ a planar transfer head, the adhesive to pick the targeted die, components and/or sub-components from the device wafer may be patterned to match the targeted die, components and/or subcomponents comprising the electronic package assembly on which they are to be deposited. In some embodiments, adhesive deposition after lithography, printed adhesives or an alternate patterning technique causes formation of a raised adhesive pattern corresponding to the pattern of targeted die, components, or sub-components to be transferred to the package assembly. Alternatively, a subtractive pattern is formed in the adhesive layer using lithography, laser removal or ashing wherein adhesive is removed from die, components or sub-components that are to remain as part of the device wafer and therefore will not be transferred by the planar transfer head. Adhesive is not removed from the targeted electronic elements on the device wafer to be transferred, which allows a transfer head having a planar surface to pick the targeted electronic elements. The adhesive can, for example, be a phenoxy material or other thermoplastic material or alternate adhesive. Adhesive may be thermally cured or cured by x-ray radiation or by alternative means. Step 59 further includes the selective de-bonding of the targeted, singulated electronic elements to be transferred.

In step 60, selected electrical elements are transferred to an electronic structure using the precision wafer transfer head 34A. In the exemplary embodiment of FIGS. 4A and 4B, which illustrate sequential steps performed in an exemplary process 50, targeted, singulated dies 32A are de-bonded from the handle wafer 26 in step 59 and transferred from the device wafer 20A to an electronic package assembly 38 in step 60. A transfer plate (not shown) with vacuum openings can hold the handle wafer(s) or handle fixture(s) to which the dies 32A are bonded. Alignment cameras (not shown) can be used to facilitate precision alignment of the transfer head 34A and device wafer 20A using fiducial markings as discussed above. Motor controls enable small positional adjustments of the transfer head with respect to the device wafer.

As further shown in FIG. 4A, the de-bonding of targeted dies 32A from the handle wafer 26 is conducted in a manner that maintains the bond between the precision wafer transfer head 34A and the targeted dies 32A. (Preferably, each group of targeted dies 32A is bonded to the transfer head 34A prior to their removal from the device wafer 20A/release from the handle wafer 26.) This may be accomplished, for example, by using different release layers 28, 28' that are ablated at different wavelengths in the electromagnetic spectrum, one for bonding the dies and handle wafer and the second for bonding the dies to the transfer head 34A. The release layer 28 is subjected to radiation 39 in selected locations corresponding to the targeted dies 32A of the device wafer 20A to be transferred. The portions of the release layer 28 beneath the targeted dies 32A are thereby ablated while the remaining portions of the release layer 28 beneath unselected dies remain solid and intact. A precision scanning laser system may provide a spot size that is stepped from electronic element (e.g. a first die 32A) for debonding or release to the next electronic element (e.g. a second die 32A) for debonding or release. The scanning pattern, frequency and pulse of the laser may be controlled during debonding. In some embodiments, a patterned masking system is employed to facilitate debonding those targeted electronic elements on the device wafer desired for transfer, the openings in the masking system corresponding to the electronic elements to be debonded and transferred. Electromagnetic radiation 39 passes through the openings in the patterned masking system, ablating discrete portions of the release layer 28 underlying the targeted dies. An exhaust port and filter/traps (not shown) may be employed to capture any laser ablation dust, debris or other byproducts. The prior removal of release layer and adhesive layer material between the singulated die facilitates their transfer from the handle wafer 26 to the precision wafer transfer head 34A in a precise manner. In embodiments where such portions of the release and adhesive layers have been removed and therefore cannot form bonds to the targeted die, release of targeted die upon ablation of the portions of the release layer remaining beneath the targeted die may be conducted with enhanced control, consistency and reliability using the method, structures and equipment described herein.

Figure 4B:
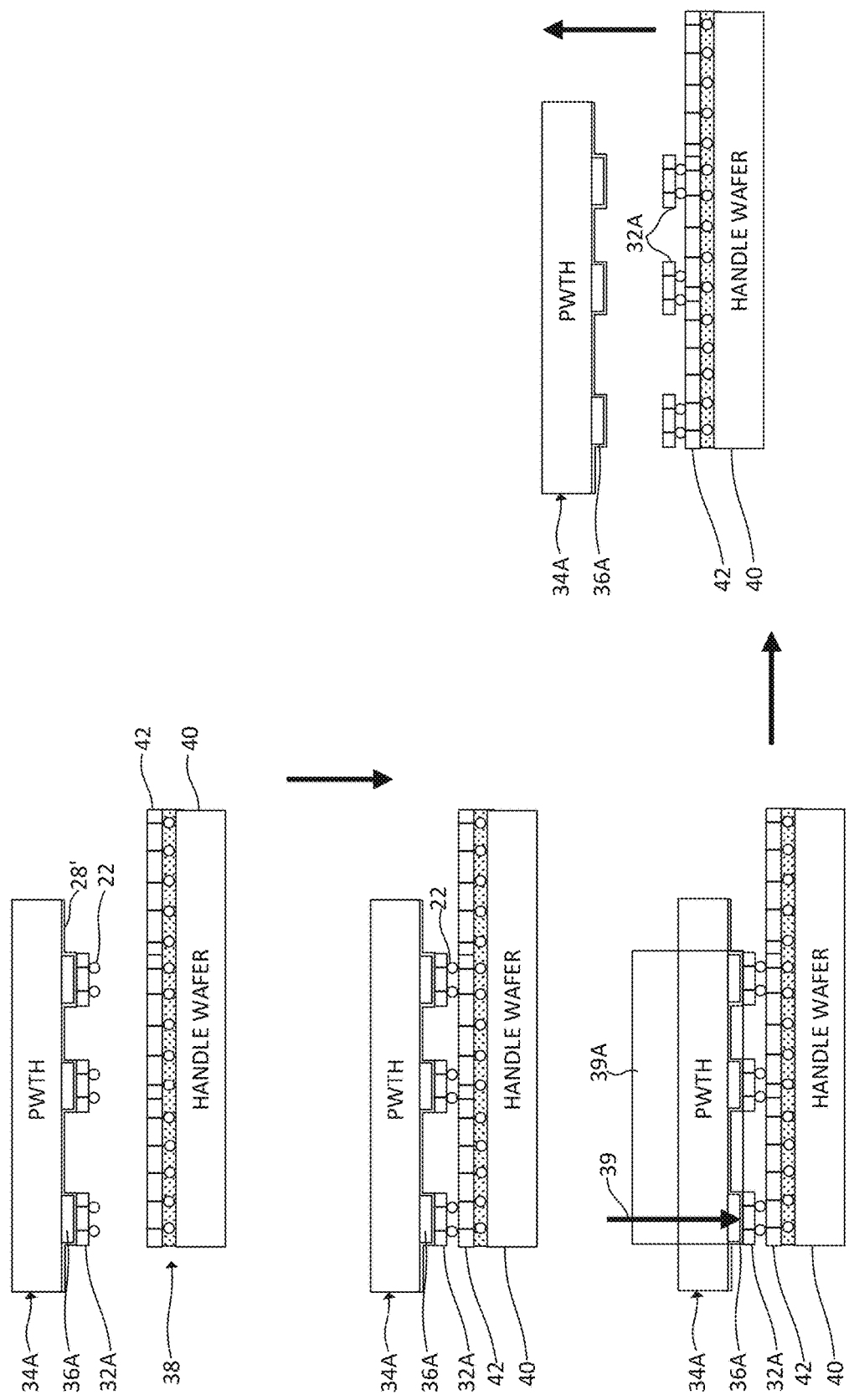
FIG. 4B schematically illustrates the transfer of the first set of dies to a package assembly using the precision wafer transfer head.

The electronic package assembly 38 as shown in FIG. 4B includes singulated electronic packages 42 attached to a handle wafer 40. The PWTH 34A is aligned with the assembly 38 such that the dies 32A carried by the raised areas 36A thereof are above and aligned with bonding sites on the singulated packages 42. Alignment fiducials on the PWTH 34A and handle wafer 40 can be used for precision alignment. The PWTH 34A and the handle wafer 40 are the same size in some embodiments. For example, a PWTH 34A having a 300 mm diameter would be aligned with a handle wafer 40 having a 300 mm diameter. However, the precision placement of die on handle wafers or handle fixtures can be made from wafers to panels or from small X-Y fixtures to either larger handle wafers or larger panel sizes. Much depends on X-Y size or diameter and precision needed for the integrated die, components and packages. Alignment fiducials and precision movement is one preferred method for integration of packages. Near placement and surface tension during reflow joining alone or combined with even more precise use of precision X-Y and/or Z stops can provide an alternate method of precision in assembly.

As discussed above, the PWTH 34A is optionally fabricated such that the raised areas 36A thereof correspond with bonding sites of a target substrate such as targeted packages 42 comprising the package assembly 38 or dies or electronic components previously incorporated as parts of the package assembly 38. The surface of the package assembly including the bonding sites may or may not be planar. The raised areas 36A conform to the topography of the package assembly, allowing the selected dies 32A on the raised areas 36A to contact the bonding sites while avoiding contact elsewhere between the PWTH 34A and the target substrate, even if the surface of the package assembly is nonplanar. The dies 32A to be transferred, being temporarily attached to the raised areas 36A, will accordingly be aligned with the bonding sites for placement thereon with sufficient precision while contact between the PWTH 34A and the package assembly 38 in regions other than the bonding sites is avoided. The dies 32A are positioned on the selected packages 42 and released from the PWTH 34A, thereby forming a structure including packages 42 and dies 32A as shown schematically in FIG. 4A. Unlike the selective release of the targeted die from the device wafer 20A as illustrated in FIG. 4A, the release of all die 32A coupled to the PWTH 34A is typically desired when the die are to be transferred to the package assembly 38. Radiation 39 may accordingly be directed over an area 39A comprising most of the surface of the PWTH 34A above the package assembly 38, as schematically illustrated in FIG. 4B. As the release layers 28, 28' have different compositions in one or more embodiments, the radiation 39 used to release the die from the PWTH 34A may not have the same wavelength as that used for releasing the die from the device wafer 20A. In embodiments wherein electromagnetic radiation is employed to ablate the release/adhesive layer 28' to release the die from the PWTH, the PWTH is at least partially transmissive to the wavelength of the electromagnetic radiation. Glass and silicon are among the materials from which the PWTH can be fabricated as they are transmissive of electromagnetic radiation that will cause ablation of one or more of the materials described herein for forming the layer 28'. Selective release of dies 32A from the PWTH 34A can, if desired, be effected using the same techniques described above for the selective release of targeted die from the handle wafer 26.

In an alternative embodiment, neither a release layer nor an adhesive layer is employed for attaching the selected dies 32A to the precision wafer transfer head 34A. Vacuum holes (not shown) are instead formed in the PWTH 34A. Vacuum is applied to couple the raised areas 36A of the PWTH to targeted dies 32A on the device wafer 20AA as the dies 32A are de-bonded from the handle wafer 26 by ablating discrete portions of the release layer 28. The vacuum is later discontinued to transfer the dies 32A from the PWTH 34A to the package assembly 38. In some embodiments, surface tension may be sufficient to couple the selected dies 32A to the precision wafer transfer head 34A upon ablation of the release layer 28 beneath the targeted dies.

Laser debonding to release the dies 32A from the precision wafer transfer head 34A and/or to release the dies 32A from the handle wafer 26 may be performed in step 61 using any one of a number of UV laser sources depending on the selected release layer, including excimer lasers operating at 308 nm (e.g. XeCl) or 351 nm (e.g. XeF) as well as diode-pumped (tripled) YAG laser operating at 355 nm or diode-pumped (quadrupled) YAG laser operating at 266 nm. Excimer lasers may be more expensive, may require more maintenance/support systems (e.g. toxic gas containment) and may have generally have very large output powers at low repetition rates (e.g. hundreds of Watts output at several hundred Hz repetition). UV ablation thresholds in the materials specified here may require 100-150 milliJoules per square cm ($mJ/cm^2$) to effect release. Due to their large output powers, excimer lasers can supply this energy in a relatively large area beam having dimensions on the order of tens of square millimeters area (e.g. 0.5 mm times 50 mm line beam shape). Due to their large output power and relatively low repetition rate, a laser debonding tool which employs an excimer laser may include a movable x-y stage with a fixed beam. Stage movement may be on the order of ten to fifty mm per second. The die 32A/handle 26 pair and/or die 32A/PWTH 34A pair to be debonded may be placed on the stage and scanned back and forth until the entire surface had been irradiated. As discussed above, a mask system may be employed to limit the applied electromagnetic radiation to selected regions of the release layer 28 bonding the singulated dies 32A that have been targeted for transfer.

In one exemplary embodiment, the joining of selected singulated dies or other electronic elements to the package assembly 38 and the debonding of such dies or electronic elements (step 61) is performed by laser release (release layer ablation) of the dies 32A bonded to the precision wafer transfer head 34A coupled with solder reflow of the ball grid arrays to join the dies to the package assembly 38 and possibly also facilitating die alignment to each package. In a first example of laser release combined with solder attachment, one can use solder attachment first such as with reflow or thermal compression bonding followed by laser release (release layer 28' ablation) from the transfer head 34A. After all dies are placed and released by laser ablation, all the components can be cleaned of any residual adhesive or release layer material such as with chemical cleaning or plasma cleaning or laser cleaning or combinations/alternatives and then followed by device or component underfill and or overmolds/seal coatings. The PWTH is optionally cleaned for reuse in step 62. A second example, also using solder, can involve bonding or placing each of the dies and other electronic elements with solder and in each case cause release by laser and subsequently perform reflow to improve alignment accuracy for some applications, especially with precision X-Y and Z alignment stops if needed. A third exemplary process flow can include transfer head placement first using a mechanical adhesive, followed by curing, then laser release and subsequent electrical interconnections of the dies and packages with wirebonding. In this third exemplary process, die, components and/or sub-components can be placed and permanently bonded in place. Subsequently the die, components and/or sub-components can be electrically connected using a wire-bonder which can provide an electrical connection from one die, component and/or sub-component to another such as but not limited to Al, Au, Cu or alternative metal wires. After wirebonding, the microsystems can be overmolded as known in the art to provide sealing, protection to the systems and wirebonds. Alternately, a post-integration interconnection of the die, components and/or subcomponents can be completed using printing of wires, writing of wires, conductive adhesives or solders, or alternately use a dielectric fill, adhesive or coating, cure, planarization (chemical-mechanical polish (CMP) or alternate method), lithographic opening through the fill or coating to vias or pads and wiring channels, metal deposition, plating or alternate means of metal deposition, planarization if needed and dielectric coating if needed and opening to pads if needed for electrical testing and/or overcoat sealing operation to complete the integrated system.

The plurality of targeted die 32A are electrically connected to the packages 40 following solder reflow of the arrays of solder bumps 22 in one exemplary process. Alternatively, the die 32A may be joined to the packages 40 with an adhesive (not shown) that forms permanent bonds between these elements. Ashing or plasma cleaning may be used to remove any excess adhesive using in joining dies and/or electrical components to the packages 40.

Figure 5:
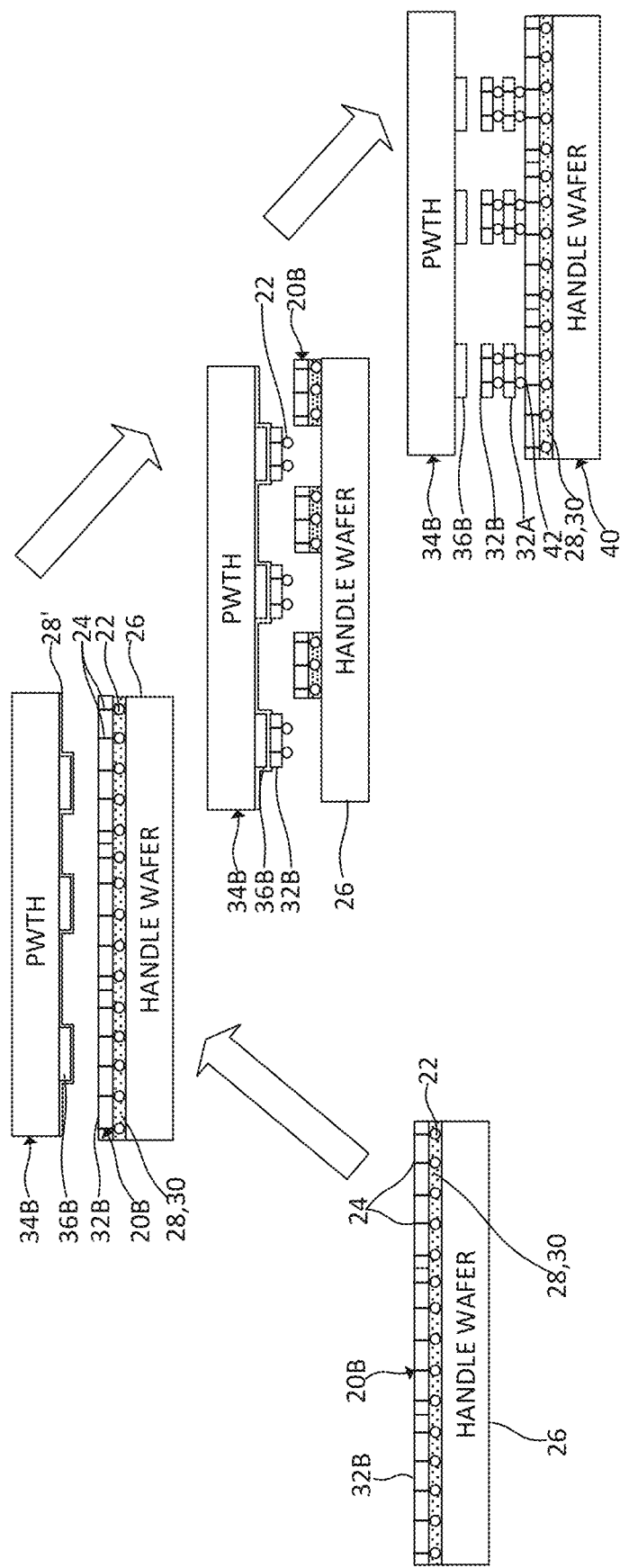
FIG. 5 schematically illustrates the transfer of a second set of dies from a second device wafer to the electronic package assembly.
Figure 6:
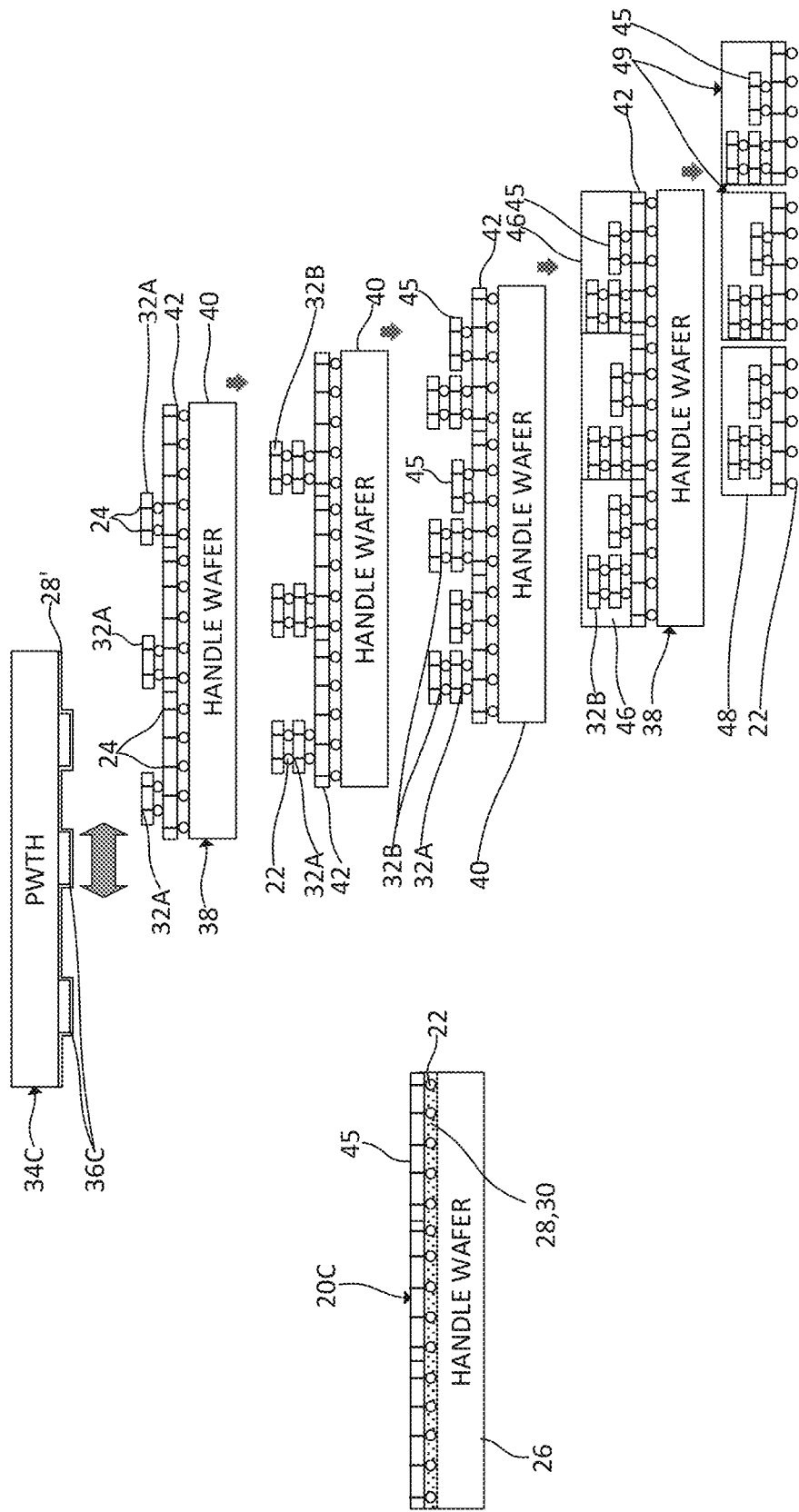
FIG. 6 schematically illustrates a multi-step process including the transfer of die and electronic components from device wafers and a component wafer to the electronic package assembly.

Step 62 (FIG. 9) involves the fabrication of additional precision wafer transfer heads 34B, 34C as shown in FIGS. 5 and 6, respectively, or alternatively the reuse of existing, previously used precision wafer transfer heads following cleaning. In this exemplary embodiment, PWTH 34B includes raised areas 36B configured to select and transfer a second set of targeted dies 32B from a second device wafer 20B or from a portion of the first device wafer 20A that includes the second set of targeted dies. Step 63 (FIG. 9) involves such transfer. The raised areas 36C of the third PWTH 34C are configured to select and transfer a set of targeted electrical components 45 as shown in FIG. 6. The PWTHs 34B and 34C are further located and configured to place the selected dies 32B and components 45 on selected bonding sites of the package assembly. The topography of the package assembly 38 changes as dies and components are incorporated. The configurations of the PWTHs 34B, 34C may be designed to reflect the changing topography, allowing dies and electronic components to be positioned at selected bonding sites on a non-planar surface. The elements shown in FIG. 5 can be fabricated using the same techniques described above with respect to the first device wafer 20A and the first PWTH 34A. If the configuration of PWTH 34B and/or 34C is the same as that of PWTH 34A, reuse of the first PWTH 34A is possible after cleaning instead of using additional PWTHs. Wafer/transfer head alignment and die transfer are accomplished in substantially the same manner as described with respect to FIGS. 4A and 4B, though the second set of targeted dies 32B are instead located on and then electrically connected to the first set of targeted dies 32A in the exemplary embodiment rather than on the packages 40 of the package assembly 38. Step 65 entails the cleaning/ashing of the precision wafer transfer heads and the structures including the transferred electronic elements.

FIG. 6 schematically illustrates the overall process flow that includes the assembly of first and second sets of targeted dies 32A, 32B to the package assembly 38, as discussed with reference to FIGS. 4 and 5, followed by the transfer to and assembly of electronic components 45 on the package assembly. The electronic components 45 may, for example, comprise active structures such as diodes, transistors, integrated circuits or arrays thereof or passive structures such as capacitors, inductive devices or antennas. Ball grid arrays may be incorporated on the components 45 for facilitating electrical connections of the components to the packages 42. A component wafer 20C is comprised of singulated components 45 from which targeted components are removed by the third precision wafer transfer head 34C, the raised regions 36C thereof being used for alignment and bonding/interconnection with the targeted components. Release and adhesive layers as discussed with respect to FIG. 1 may also be used to bond the component wafer 20C to a UV-transmissive or IR-transmissive handle wafer 26. The component wafer 20C may then subjected to thinning prior to component singulation and transfer. In some embodiments, the raised regions 36C of the third PWTH 34C are coupled to selected components 45 by an adhesive and/or ablatable release layer when component transfer is begun. Selective ablation of portions of the release layer between the handle wafer 26 and the singulated components 45 allows the release of targeted components from the handle wafer for transport to the package assembly 38 using the PWTH 34C or other means. Following alignment with and transfer of the targeted components 45 to the package assembly 38, the components 45 are released from the PWTH 34C via laser ablation and joined to the packages 40 on the package assembly 38 via solder reflow in step 64 (FIG. 9). Precision alignment of the components 45 (or chips) to the bonding sites of the package assembly may be enhanced using surface tension in embodiments wherein solder joints are formed. When solder melts to join two elements, the solder will try to obtain the lowest energy state and smallest volume. During reflow at a temperature of approximately 260° C. for solder bump arrays employing SnAgCu solder, the solder melts and can pull a component or chip into position between precision placed electrical pads of the underlying structure. The same can be done with no stops or with precision etched mems stops for X-Y and Z dimensions; one can use the sub-micron precision of semiconductor lithography and etching to achieve sub-micron precision alignment of components. In other words, solder surface tension alone with precision pads can be used to align hardware with an array of solder bumps. Higher precision can be obtained using stops for X, Y and or Z precision alignment, though at higher cost. Both the package assembly and PWTH 34C are then cleaned in step 62 (FIG. 9) as may be necessary using chemical cleaners, $O_2$ ashing, and/or other conventional techniques. The precision wafer transfer heads 34A, 34B, 34C are re-used in some embodiments once cleaned. Additional precision wafer transfer heads may be employed in embodiments where re-use of existing precision transfer heads is inconvenient or impossible.

The processes described with respect to FIGS. 4, 5 and 6 are repeated as required until all dies, components, and/or other electronic elements are transferred and integrated into electrical device(s). The processes may be used to handle integrated circuit chips, batteries, antennas, sensors and/or other components or sub-components ("electronic elements") that may be required. Overmolding and sealing structures 46 are formed as needed with appropriate sealing materials such as $SiO_x$ or $SiN_y$. Electronic microsystems 49 are singulated and released from the handle wafer 40. Release of the microsystems 49 may be effected via laser ablation of a release layer between the handle wafer 40 and the packages 42 thereon in some embodiments. The microsystems can later be incorporated within a system (not shown).

The process as described above involves the use of area array dicing of a thinned device or component wafer to provide small dies or electronic components on a handle wafer which are then transferred using a transfer head to electronic structures such as packages or 3-D chip stacks. Release layers and adhesives can be chosen such that bonding and de-bonding of the dies may be conducted at room temperature. Electrically conductive adhesives can be employed in some embodiments for die bonding in place of solder. The process is also compatible with fan-out WLP (FOWLP) technology for semiconductor devices requiring a higher integration level and a greater number of external contacts than standard wafer-level packages. In conventional WLP schemes, I/O terminals are located over the chip surface area. Fan-out WLP takes individual die and embeds them in a low cost material such as epoxy mold compound (EMC) with space allocated between each die for additional I/O connection points, thus avoiding the use of relatively expensive silicon real estate to accommodate a high I/O count. Redistribution layers (RDL) are formed using, for example, PVD seed deposition. Subsequent electroplating/patterning re-routes I/O connections on the die to the mold compound regions in the periphery.

In an alternative embodiment, the handle wafer holding the device die (e.g. handle wafer 26) or other electronic elements (e.g. handle wafer 40) is used to precision transfer a preferably periodic, stepped row or an area array of a plurality of die or other electronic elements directly to matching bonding surfaces of a matching row or area array of a package assembly 38. A precision wafer transfer head is not required in this alternative embodiment. For example, every fourth die in a row or every fourth die in an area array of singulated die can be selected for a first transfer using the handle wafer 26. The process is repeated, causing selection of the next stepped die in the same row or area array in a sequence to transfer and bond rows of singulated die and area arrays of singulated die, respectively. The selected die or electronic elements may have interconnection surfaces as described above, such as but not limited to solder bumps or pillar/solder interconnections on the die (or other electronic element) opposite to the handle wafer. The die and/or other electronic elements and underlying adhesive/release layer between (and/or at the perimeter of) the die and/or electronic elements can be singulated by laser, reactive ion etch, deep reactive ion etch, saw sizing and/or chemical etch methods as indicated above. Following device wafer thinning and singulation, the targeted sequenced row or area array of the die and/or other electronic elements can be directly bonded to the corresponding system or subsystem package. Laser release of the die/electronic elements from the handle wafer may, for example, be subsequent to full bonding thereof to the bonding sites of the system or subsystem package. Alternatively, laser release can be effected prior to full bonding of the die/electronic elements to the bonding sites. The die/electronic elements may, in some embodiments, be sequentially deposited on a fluxed surface of each bonding site, released via laser debonding from the handle wafer, and subjected to a full bonding reflow. As known in the art, bonding of the die/electronic elements to a system or subsystem package may include thermal compression bonding, reflow, conductive adhesive bonding and curing or alternative bonding methods. Electronic element deposition, debonding and bonding steps can be repeated to transfer rows or area arrays of die and/or electronic elements from the same handle wafer or multiple handle wafers to other wafers, panels or roll to roll reels including die, sensors, antenna, batteries, electrodes, packages and other electronic elements thereon. This alternative method permits for very low cost, precision fabrication of, for example, 2D planar assembled systems and 3D stacked die/electronic element assemblies, and other heterogeneous integration of die and/or electronic elements at low cost for prototyping or for high volume, low cost precision integration of systems, microsystems, sub-systems and/or products for any electronic applications.

Figure 12A:
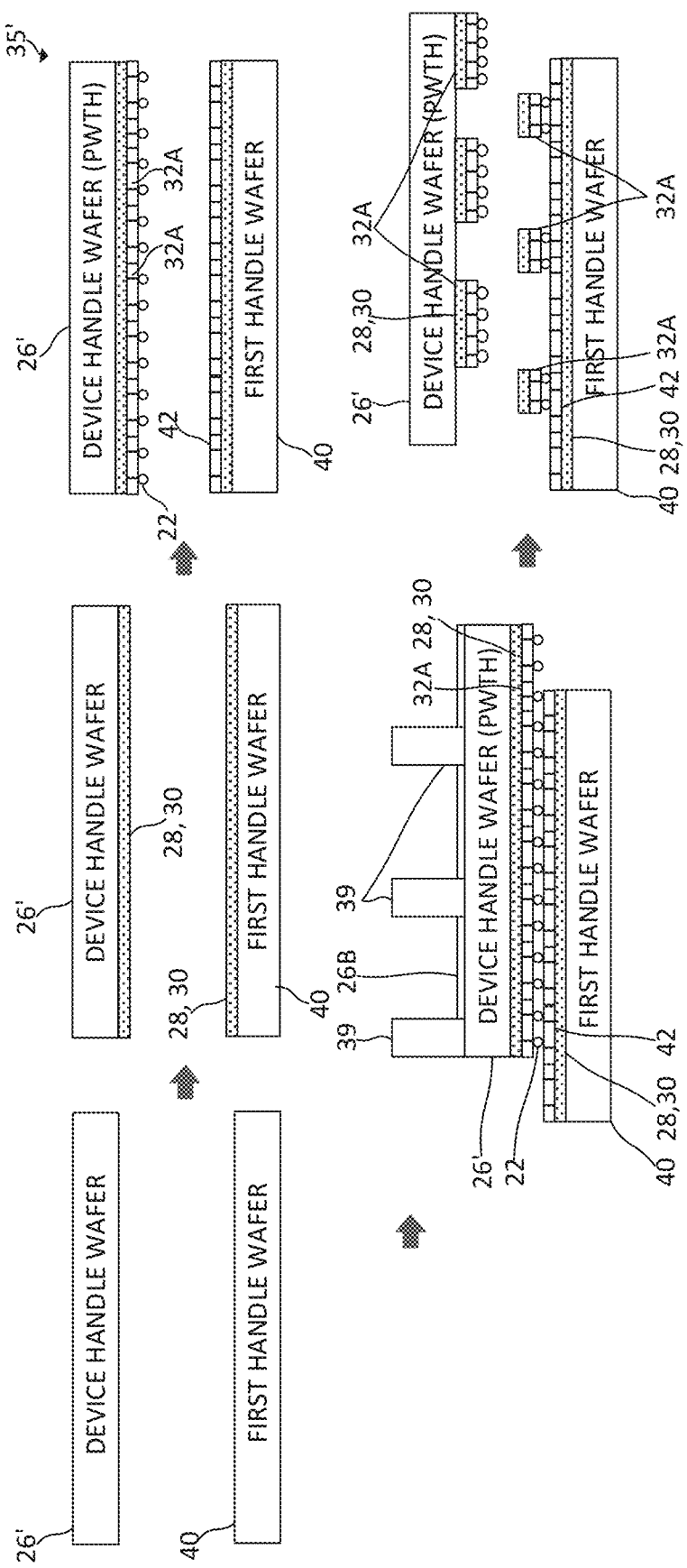
FIGS. 12A-12C schematically illustrate exemplary steps showing transfer of electronic elements from a handle wafer to a package assembly using a planar carrier, and FIGS. 13A-13C schematically illustrate exemplary steps showing direct transfer of electronic elements from a singulated device wafer to an electronic package assembly.
Figure 12B:
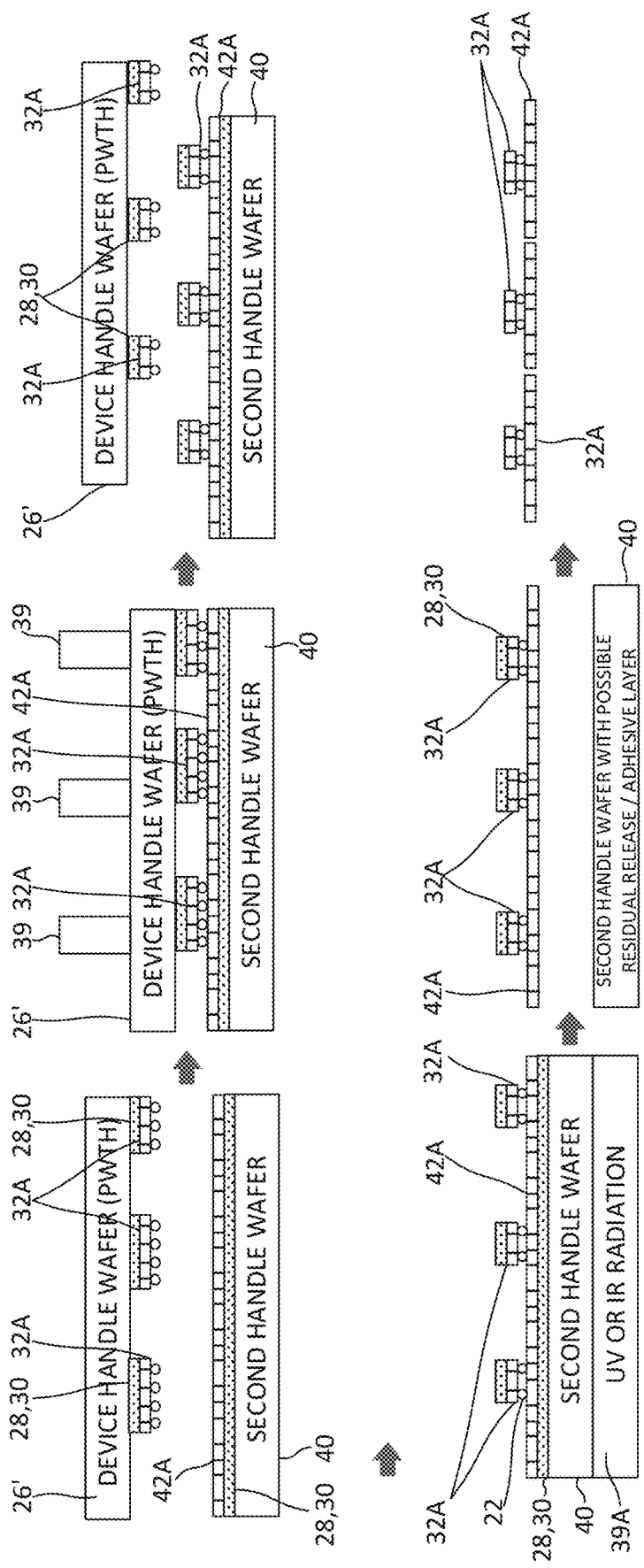
Figure 12C:
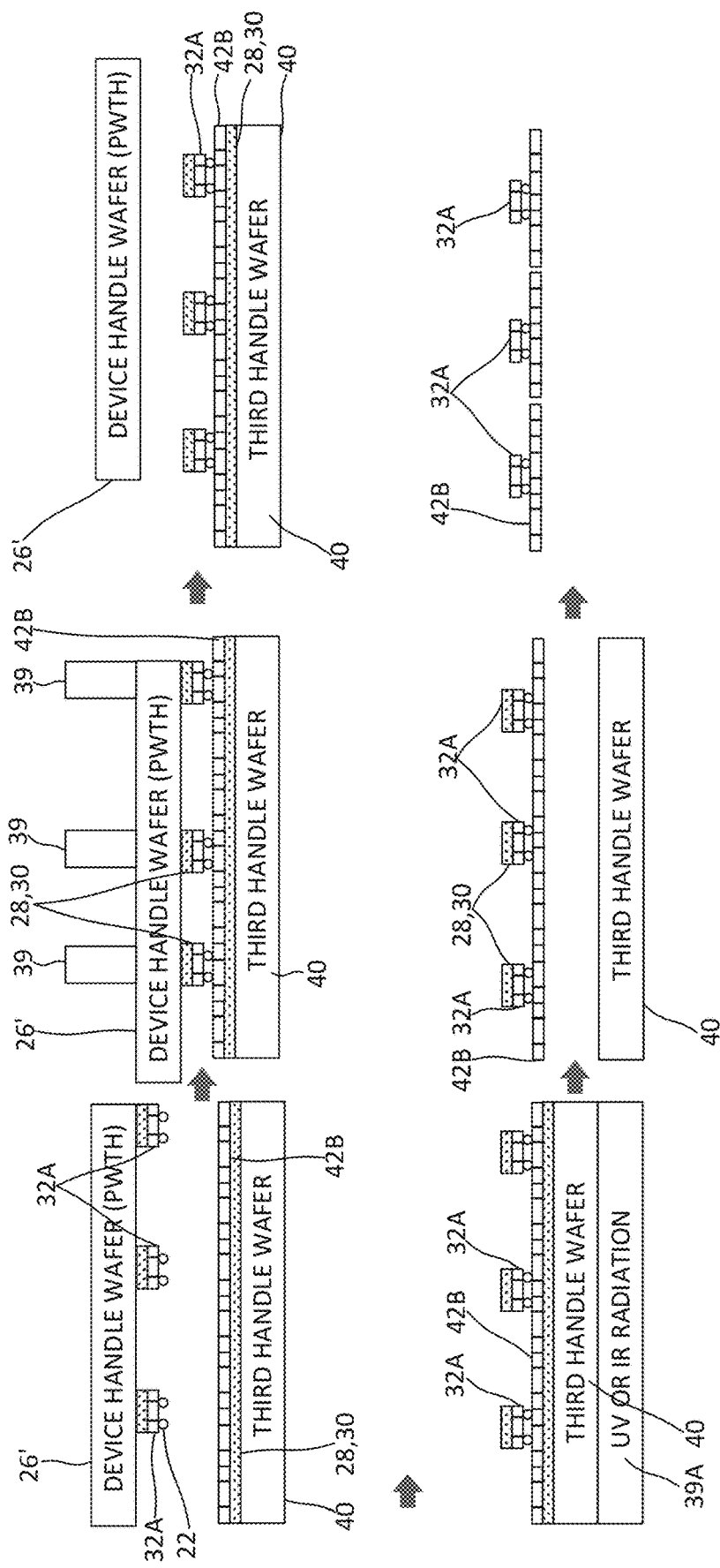

FIGS. 12A-12C show exemplary steps and structures used in the transfer of selected electronic elements, for example rows and/or area arrays of such elements, from a planar carrier to an electronic package assembly. The assembly 35' includes a singulated and possibly thinned device wafer that is attached to the planar carrier by release and adhesive layers 28, 30, examples of which are described above. The planar carrier is identified as a device handle wafer 26' in FIGS. 12A-12C and can have the same size and composition as the handle wafer 26 on which the device wafer is singulated, though such similarity is not required.

The release and adhesive layers 28, 30 (or alternatively a monolithic release/adhesive layer) are applied as blanket layers to the device handle wafer 26' to be later used as a precision wafer transfer head. The device handle wafer 26' is then moved towards a singulated device wafer such that the layer(s) 28, 30 contact an exposed surface of the device wafer. Such movement is illustrated in FIG. 4A with respect to a non-planar precision wafer transfer head 34A. Selective release of singulated electronic elements from the device wafer from the handle wafer 26 as shown in FIG. 4A is not, however, required in this embodiment. An area of the handle wafer 26 corresponding to the size of the device handle wafer 26' positioned thereon may be subjected to UV or IR radiation, thereby causing ablation of the release layer thereon and thereby the release of all the singulated electronic elements in the area from the handle wafer 26. If the device handle wafer 26' is the same size or larger than the handle wafer 26, all of the singulated electronic elements (e.g. dies 32A) comprising the device wafer can be released from the handle wafer 26 and attached to the device handle wafer 26'. The assembly 35' shown in FIG. 12A is accordingly obtained. An array of solder bumps 22 formed on the device wafer allows attachment and electrical connection of the dies 32A comprising the device wafer to other electronic structures. As discussed above, singulated electronic elements other than dies may instead be coupled to the device handle wafer 26'.

Steps employed in the fabrication of a package assembly are also schematically illustrated in FIG. 12A. In this exemplary embodiment, a release layer and an adhesive layer 28, 30 are deposited on a first handle wafer 40. Electronic packages 42 are coupled to the first handle wafer by positioning them on the release/adhesive layer 28, 30. The electronic packages may or may not comprise identical elements. For example, the electronic packages 42 may include a combination of integrated circuit packages, antennas, and/or energy sources such as batteries and capacitors. The top surfaces of the electronic packages 42 include bonding sites configured for the electrical connection of singulated electronic elements to be transferred from the device handle wafer 26'. A chemical etch or laser cut of the release/adhesive layer 28, 30 at perimeters of the singulated electronic elements (e.g. dies 32A) attached to the device handle wafer 26' is conducted in some embodiments of the process.

Figure 4C:
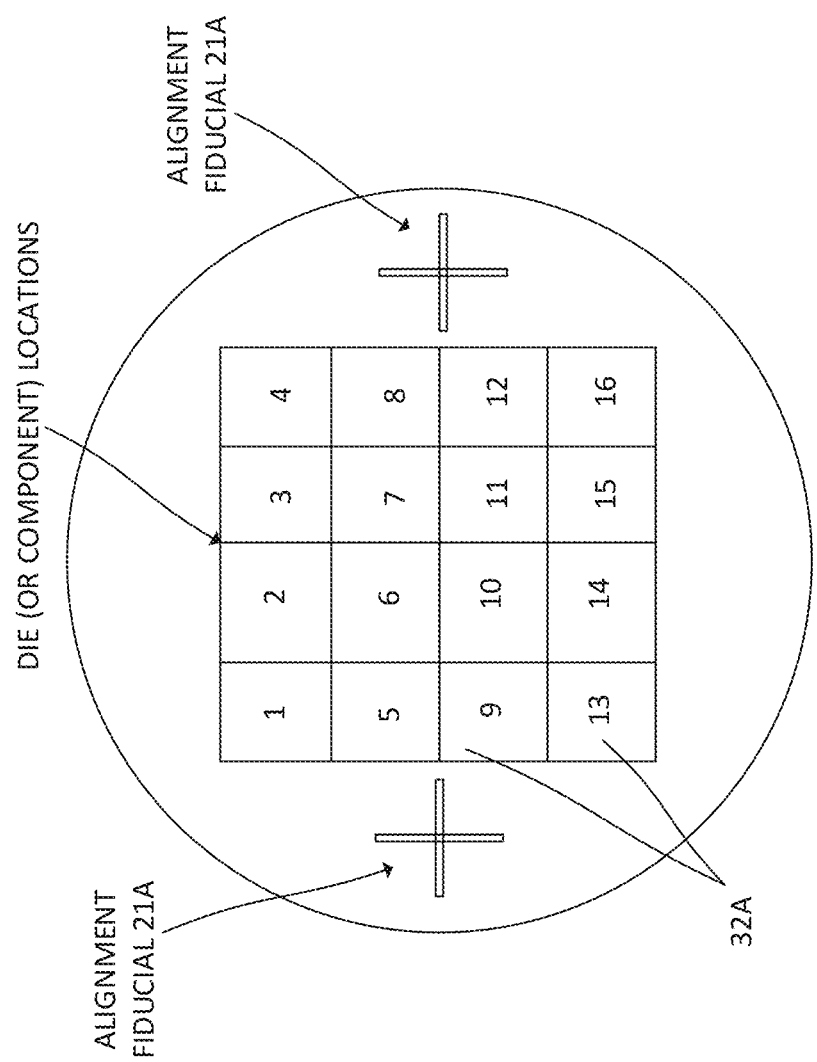
FIG. 4C is a top plan view schematically illustrating the device wafer and alignment fiducials thereon.

Referring again to FIG. 12A, the assembly 35' is positioned such that the device wafer including the singulated dies 32A is in opposing relation to the top surface of the electronic packages 42. Alignment fiducials on the assembly 35' and the electronic package assembly are employed to provide precision alignment of the two structures. (Alignment fiducials (markers) 21A are schematically illustrated in FIG. 4C and are included on a portion of each handle wafer 26', 40 in some embodiments.) A visual alignment detector as monitors the alignment fiducials to ensure the die or component locations of the handle wafer/device wafer assembly 35' and the associated solder bumps 22 are precisely aligned with the targeted bonding sites of the opposing electronic package assembly. The targeted plurality of singulated electronic elements (e.g. dies 32A) are accordingly aligned with targeted bonding sites and associated targeted electronic packages 42 of the electronic package assembly. The handle wafer/device wafer assembly is brought into contact with the electronic package assembly such that the solder bumps 22 on the device wafer adjoin the bonding sites on the electronic package assembly. The alignment fiducials are monitored using a visual system (not shown). Positioning adjustments, if necessary, are made as the structures are moved into engagement. Electromagnetic radiation 39 is directed through the handle wafer 26 of the handle wafer/device wafer assembly 35' from a source of ultraviolet or infrared radiation once the handle wafer/device wafer assembly is properly aligned and in adjoining relation to the electronic package assembly. In some embodiments, a patterned mask 26B as shown in FIG. 12A is formed on the device handle wafer 26' to allow selective passage of the electromagnetic radiation 39 to the portions of the release layer adjoining the targeted electronic elements while blocking transmission to other portions of the release layer. The targeted elements are optionally bonded to the package assembly prior to ablation of the release layer by the electromagnetic radiation. The transfer of electronic elements from the device handle wafer 26' to the package assembly can support rapid transfer and bonding from small (1-1,000) to large quantities of (hundreds of thousands or millions) of die or electronic components in short periods of time while maintaining high precision of 1 to 2 µm transfer accuracy or possibly higher precision. This permits programmable prototyping at low cost or high volume manufacture of small systems at very low cost by splitting the cost of tooling and processing for prototyping and production. High speed assembly and integration is facilitated to fabricate, for example Internet-of-Things (IoT) systems, pill tracking tags, health-care sensors and other integrated micro-systems at very low cost. The methods further permit the handling of large size (1-10 mm dimension(s) or greater) dies and components such as antenna, batteries, dies, displays, photosensitive devices, packages, flexible packaging as well as very small die and components such as micro-controllers, RFID tags, smart tags, memory devices, capacitors, and light emitting diodes. Elements having a maximum dimension of less than 10 µm in diameter are transferred from the device handle wafer 26', which functions as a precision wafer transfer head (PWTH), and bonded to the package assembly in some embodiments. FIG. 12A illustrates selective ablation of the release layer and bonding of targeted electronic elements to the package assembly at the appropriate bonding sites thereon. The targeted electronic elements to be transferred and the targeted packages 42 are precise, known distances from the alignment fiducials on the handle wafers 26, 40. The alignment of the alignment fiducials, as detected by the visual detecting system, ensures that the targeted electronic elements are transferred and bonded at the bonding sites to targeted packages 42 while un-targeted electronic elements remain on the device handle wafer 26'.

Following ablation of the release layer that causes the release of the targeted electronic elements and the selective bonding of the targeted electronic elements to the electronic package assembly using solder reflow, the assembly 35', now missing the transferred, targeted electronic elements, is displaced with respect to the electronic package assembly as schematically illustrated in the final step of the sequence illustrated in FIG. 12A. The targeted electronic elements (e.g. dies 32A), having been bonded to the targeted packages 42 by reflow of selected solder bumps 22 in accordance with one embodiment, remain attached to the electronic package assembly. The un-targeted electronic elements of the device wafer remain bonded to the device handle wafer 26' following separation of the two structures from each other as reflow is restricted to the regions in which the targeted electrical elements contact the targeted bonding sites on the electronic packages 42.

Referring now to the first figure of the sequence illustrated in FIG. 12B, the transfer assembly including the initially un-targeted electronic elements 32A is positioned in opposing relation to targeted packages 42A of a second handle wafer 40 and aligned therewith. The solder bumps 22 on the singulated electronic elements remaining on the device handle wafer 26' are moved into contact with targeted bonding sites of the packages 42A on the second handle wafer 40 as schematically illustrated in the second figure of the sequence. While maintaining such contact, electromagnetic radiation 39 is directed through the device handle wafer 26' to ablate selected portions of the release layer 28 between targeted electronic elements (such as dies 32A) and the device handle wafer 26'. Selective reflow of the solder bumps 22 associated with the targeted electronic elements causes their attachment and electrical connection to selected packages 42A attached to the second handle wafer 40. The device handle wafer 26', which includes fewer electronic elements attached thereto following transfer of the additional targeted electronic elements 32A to the packages 42A, is displaced with respect to the electronic package assembly as shown in the third figure of the sequence illustrated in FIG. 12B. There may be residual layers of release/adhesive material on each of the transferred electronic elements.

Referring again to the sequence of steps illustrated in FIG. 12B, electronic radiation 39A is directed through the second handle wafer 40, causing ablation of the release layer 28 between the electronic packages 42A and the second handle wafer 40. UV or IR radiation may be employed depending on the composition of the release layer. All packages 42A are released from the second handle wafer 40 in the non-selective ablation illustrated in the fourth figure of the exemplary sequence. An assembly including the packages 42A and attached electronic elements (dies 32A in the exemplary process) is displaced with respect to the second handle wafer 40, as schematically illustrated in the fifth figure of the sequence. Residual release/adhesive material may remain on both the second handle wafer 40 and the dies 32A attached to the packages 42A. Such material can be removed from both the second handle wafer and the dies using conventional cleaning techniques such as chemical etching and/or ashing or alternative cleaning steps. The final figure in the illustrated sequence shows the assembly of packages and electrically connected dies 32A following a cleaning process causing the removal of residual release/adhesive material.

FIG. 12C shows an additional sequence that follows the sequences discussed above with respect to FIGS. 12A and 12B. The device handle wafer 26' having the remaining dies 32A following the previous sequence (FIG. 12B) is positioned in opposing relation to electronic packages 42B on a third handle wafer 40. Alignment fiducials may be employed to ensure the two assemblies are properly aligned. The solder bumps 22 on the singulated electronic elements remaining on the device handle wafer 26 are moved into contact with targeted bonding sites of the packages 42B on the third handle wafer 40 as schematically illustrated in the second figure of the sequence. While maintaining such contact, electromagnetic radiation 39 is directed through the device handle wafer 26' to ablate the portions of the release layer 28 between targeted electronic elements (such as dies 32A) and the device handle wafer 26' used to transfer the electronic elements from the singulated device wafer. In this particular embodiment, the only remaining portions of the release and adhesive layer 28, 30 adjoin the dies 32A to be transferred. The electromagnetic radiation 39 for causing release layer ablation is nevertheless directed to discrete locations rather than through most or all of the device handle wafer 26' in some exemplary embodiments. Reflow of the solder bumps 22 associated with the targeted electronic elements causes their attachment and electrical connection to selected packages 42B attached to the third handle wafer 40. The device handle wafer 26', which now includes no electronic elements attached thereto following transfer of the last remaining electronic elements to the packages 42B, is displaced with respect to the electronic package assembly as shown in the third figure of the sequence illustrated in FIG. 12C. There may be residual layers of release/adhesive material on each of the transferred electronic elements attached to the selected packages 42B.

Referring further to FIG. 12C, electronic radiation 39A is directed through the third handle wafer 40, causing ablation of the release layer 28 between the electronic packages 42B and the third handle wafer 40. All packages 42B are released from the third handle wafer 40 in the non-selective ablation illustrated in the fourth figure of the exemplary sequence. An assembly including the packages 42B and attached electronic elements (dies 32A in the exemplary process) is displaced with respect to the third handle wafer 40, as schematically illustrated in the fifth figure of the sequence. Residual release/adhesive material may remain on both the third handle wafer 40 and the dies 32A attached to the packages 42B. Such material can be removed from both the third handle wafer and the dies using conventional cleaning techniques such as etching. The final figure in the illustrated sequence shows the assembly of packages 42B and electrically connected dies 32A following a cleaning process causing the removal of residual release/adhesive material. The device handle wafer 26 and the third handle wafer 40 are reused in some embodiments.

It will be appreciated that the first, second and third handle wafers 40 for supporting the packages 42, 42A, 42B may be round glass or silicon wafers having standard or non-standard dimensions. In some embodiments, the first, second and third handle wafers can be in the form of rigid panels that may not be round. In some further embodiments, the first, second, and/or third handle wafers are flexible, roll to roll structures supported by reels such as polyimide tapes. Regardless of form, the handle wafers employed in the process exemplified in FIGS. 12A-12C are transmissive of radiation in the frequency range necessary to de-bond the electronic packages therefrom subsequent to incorporation of the dies or other electronic elements from the device wafer(s) on the electronic packages.

Figure 10:
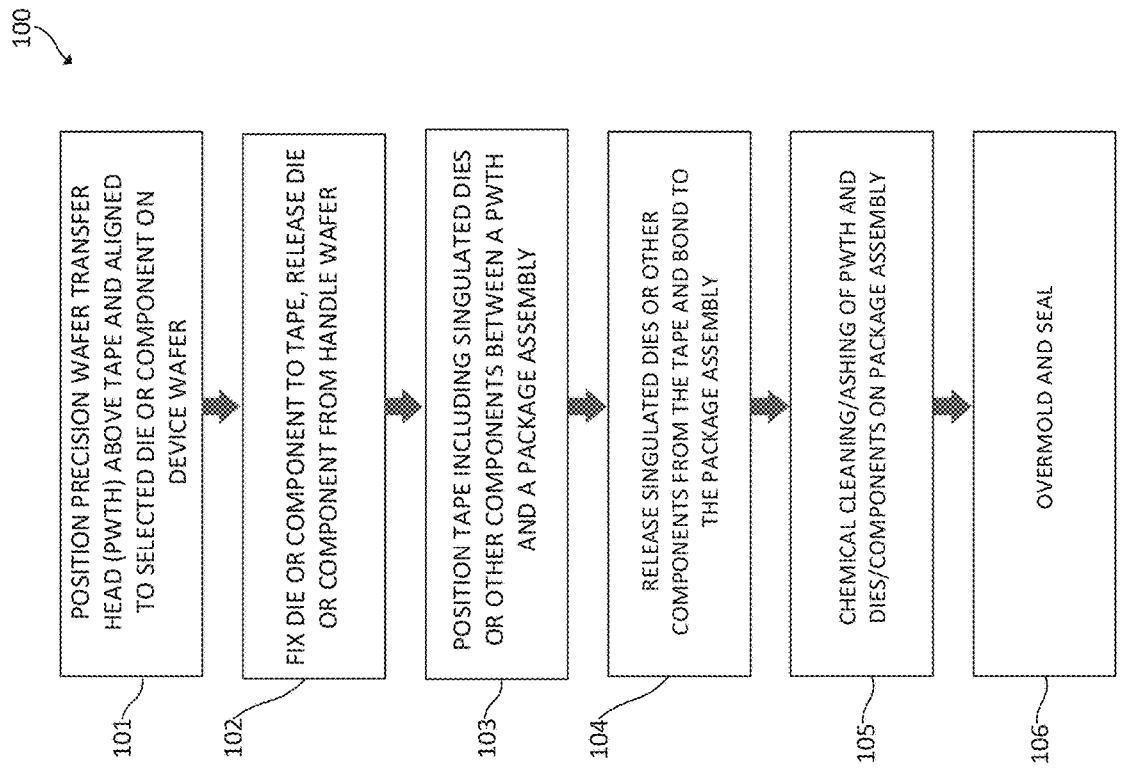
FIG. 10 is a flow diagram showing the assembly of dies and electronic components on an electronic package assembly using tape to transfer selected dies and/or other electronic components.

FIG. 10 is a flow chart showing exemplary steps of a method 100 that may be performed in accordance with an alternative embodiment. Flexible tape is employed as a carrier for transferring targeted singulated die or electronic components. Step 101 is directed to positioning a precision wafer transfer head above a flexible tape and in alignment with selected die or electronic components bonded to a handle wafer. The tape material can be made from a polyimide based material, benzocyclobutene (BCB) material, or a composite tape of polymer and metal and/or glass. Alternatively, a rubberized material such as silicone rubber can be employed. A compliant rubberized (e.g. silicone rubber) tape can be expanded in spacing and joined to a more rigid dielectric tape or framing for reel to reel structure and controlled spacing. The thickness range of the tape material and adhesive can be 50 µm to 500 µm for the tape and less than 1 µm to 20 µm for the adhesive material used on the tape for attachment to the dies 32A or electronic components. A polyimide (PI) or alternative material layer of appropriate thickness can be transmissive of UV radiation while exhibiting low absorption of such radiation. Thus, a roll layer of PI or alternate material having a UV-absorptive release layer may be used to hold and release a die, component or subcomponent in some embodiments. FIG. 8A schematically illustrates a transfer head 34A above the tape 76 and aligned with singulated dies of a device wafer 20A. (The same arrangement can be employed to select singulated electronic components of a components wafer and cause their attachment to flexible tape 76.) The precision wafer transfer head includes raised regions 36A in some embodiments to facilitate targeted chip or component transfer from the handle wafer 26 to the tape 76. FIGS. 1-4 and the corresponding portions of the patent specification are relevant to the process 100, it being appreciated that subsequent die transfer in the alternative process 100 is from a tape to the package assembly 38 rather than from the precision wafer transfer head 34A to the package assembly as conducted in process 50. The precision wafer transfer head 34A (or raised regions 36A thereof in embodiments including such regions) and the device wafer 20A are brought into contact with one surface of the tape 76 as shown in FIG. 8A. The opposite surface of the tape 76 is an adhesive surface whereby such contact affixes the targeted die to the tape. As further illustrated in FIG. 8A, laser radiation 39 is directed to selected regions 39B of the handle wafer 26 vertically aligned with the targeted die 32A to be attached to the tape 76 and the raised regions 36A of the precision wafer transfer head 34A. Ablation of the portions of the release layer 28 aligned with the targeted die causes release of the targeted die 32A from the handle wafer 26 in step 102. A patterned mask on a surface of the handle wafer 26 includes openings corresponding to the selected regions 39B of the handle wafer and the targeted portions of the release layer to be ablated in some embodiments. The laser radiation passes through the mask openings and handle wafer 26 but is otherwise blocked by the mask. In other embodiments, the laser spot size may be sufficient to ablate the selected regions of the release layer, allowing the release of targeted dies or other components from the handle wafer. Stepping of the laser spot from targeted die to targeted die may be employed to ablate discrete portions of the release layer. Tophat beams may be employed in some embodiments.

FIG. 8B shows the alignment of the precision wafer transfer head 34A with the handle wafer 26 using alignment fiducials 34AA, 26A on these elements. The die 32A to be selected from the device wafer are precise, known distances from the fiducials. Accordingly, when alignment of the fiducials is detected by a visual system (not shown), the raised regions 36A of the precision wafer transfer head 34A are aligned with the die 32A to be selected and attached to the tape 76. UV radiation 39 from a laser source (not shown) is directed through the UV-transmissive handle wafer and causes release of the selected dies 32A from the handle wafer upon ablation of the portion of the release layer beneath each selected die. In embodiments including a patterned mask beneath the handle wafer 26, the mask includes openings that will be aligned with the raised regions 36A and targeted die 32A. Areas 39B as shown in FIG. 8B correspond to mask openings in some embodiments.

As discussed above, step 102 includes the de-bonding of singulated dies or electronic components from the handle wafer 26 and their attachment to a flexible tape 76 rather than to a precision wafer transfer head as described above with respect to the process 50. In this approach, an area array of device die and/or electronic components from a wafer can be transferred to a tape to form either a singular row or multi-component rows of die or electronic components attached to a roll to roll tape. As with the area array transfer of electronic elements discussed above, in this approach, the handle wafers holding the die or electronic components have fiducial marks 26A that facilitate precise placement of the die or electronic components on the tape(s). The device die and electronic components are joined to the roll to roll tapes using a low temperature/fast cure adhesive such as UV cure, low-temperature cure or X-Ray cure adhesives. Such adhesives are known to the art and commercially available.

FIG. 8C schematically illustrates the selected dies 32A attached to the tape 76 following laser release from the handle wafer 26. The precision wafer transfer head 34A and the remaining portion of the device wafer 20A attached to the handle wafer 26 are moved away from the tape 76, leaving the selected dies 32A attached to the tape. Reels of electronic elements (e.g. die) may accordingly be obtained.

Figure 7:
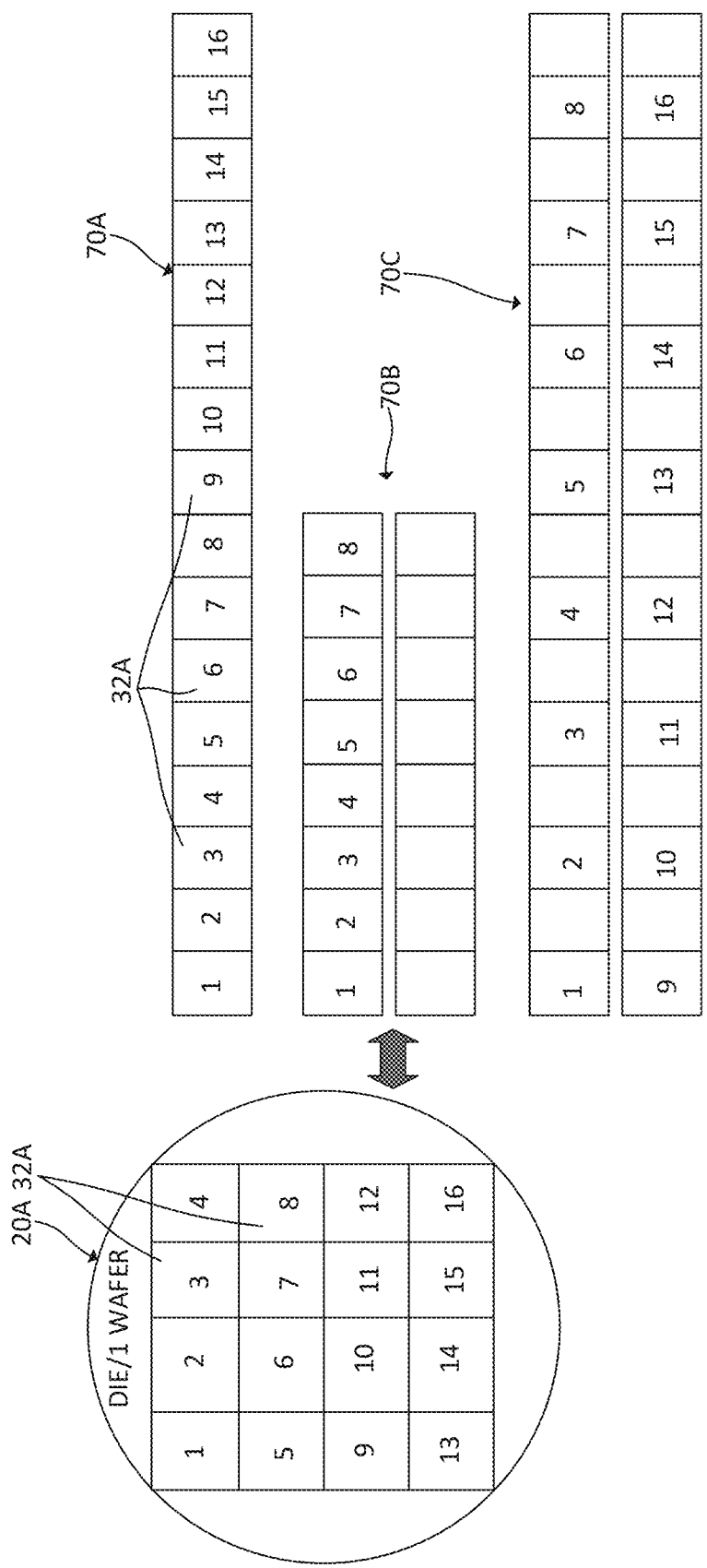
FIG. 7 is a top plan view showing a diced wafer including singulated devices and the transfer of the singulated devices in three exemplary patterns.

Referring to FIG. 7, a device wafer 20A including an array of singulated dies 32A is schematically illustrated. The dies 32A, numbered 1-16 for illustrative purposes, are greatly enlarged, it being appreciated that the device wafer 20A would normally include a much greater number of dies that possibly enable tight pitches of less than one hundred microns upon integration within a package assembly. Die size in one or more embodiments is less than one square millimeter (e.g. 500 μm by 500 μm, 200 μm by 200 μm, 50 μm by 50 μm, or an alternate size). The surface areas of the discrete raised regions of the transfer head may have the same dimensions as the dies 32A or be somewhat smaller. The strips 70A, 70B and 70C shown opposite to the wafer 20A schematically represent three possible arrangements of the dies 32A transferred from the device wafer 20A to a precision wafer transfer head (not shown) and later to a tape. In one strip 70A, the dies 32A are arranged as a single row and in adjoining relation to each other. In a second (middle) strip 70B, the dies are arranged as two adjoining rows, one containing die numbers 1-8 and the other die numbers 9-16. The third strip 70C includes two adjoining rows, but the dies in each row are equally spaced and non-adjoining. The tape to which the die are transferred by the PWTH is wound on a reel in some embodiments.

In step 103, the tape 76 is positioned between package assemblies 38 including electronic packages 42 and precision wafer transfer heads 34A having raised regions 36A, as schematically illustrated in FIG. 8D. Transfer heads or fixtures with non-raised features are also possible for facilitating transfer of die or components, but are not shown in this example. The raised areas 36A of the precision wafer transfer heads 34A are vertically aligned with the dies 32A attached to the tape 76. In this embodiment, the tape extends between a pair of reels 72, 74. The portion of the tape on the first reel 72 includes dies 32A or electrical components to be deposited on the package assemblies 38 while the second reel 74 is used to wind the tape after the dies 32A have been released therefrom.

Alignment fiducials can be laser etched or printed on the tape 76 or package assemblies 38 as well as the precision wafer transfer head 34A to facilitate die transfer in this step 103, similar to the manner they are employed in step 101 described above. The alignment fiducials can be used to transfer a row of single or multi-die or electronic components from the roll-to-roll tape 76 to build integrated subsystems or systems. Spacing between die or electronic components and adjacent die or electronic components can be based on the wafer fabrication numeric pitch or an integer number of the wafer fabrication pitch based on handle wafer transfer. In some embodiments, spacing is expanded based on controlled tape stretching relative to the tape material, material elastic modulus and expansion under tensile forces and roll to roll references versus desired spacing and alignment marks. Pressure is exerted on the tape by the precision wafer transfer heads 34A and the package assemblies 38, causing the selected dies 32A to directly contact the package assemblies.

Step 104 includes releasing the singulated dies 32A (or electronic components) from the tape 76 and bonding them directly to the package assemblies 38 or to electronic structures that have already been bonded to the package assemblies. The tape 76 can, in some embodiments, include a release layer that will be ablated upon being subjected to radiation at a specific wavelength. In such an embodiment, both the precision wafer transfer head 34A and the tape body should be highly transmissive of the radiation used for ablation. Alternately, the die or electronic components can be released from the tape using the push pin approach without laser debonding, which is a well-known technique for removing die from dicing tape. As discussed above, solder reflow may, for example, be employed for bonding the die 32A to the package assembly. The integration of die and/or electronic components to the package assembly 38 continues until completion. The precision wafer transfer heads 34A and package assemblies 38 are separated from the tape 76 following die transfer and solder reflow, as illustrated in FIG. 8E. The die 32A/components on the package assembly 38 are then subjected to chemical cleaning and/or ashing in step 105. Once all selected die 32A and electronic components are integrated on the packages 42 of package assembly 38, the structures obtained can be overmolded and sealed in step 106.

Figure 11:
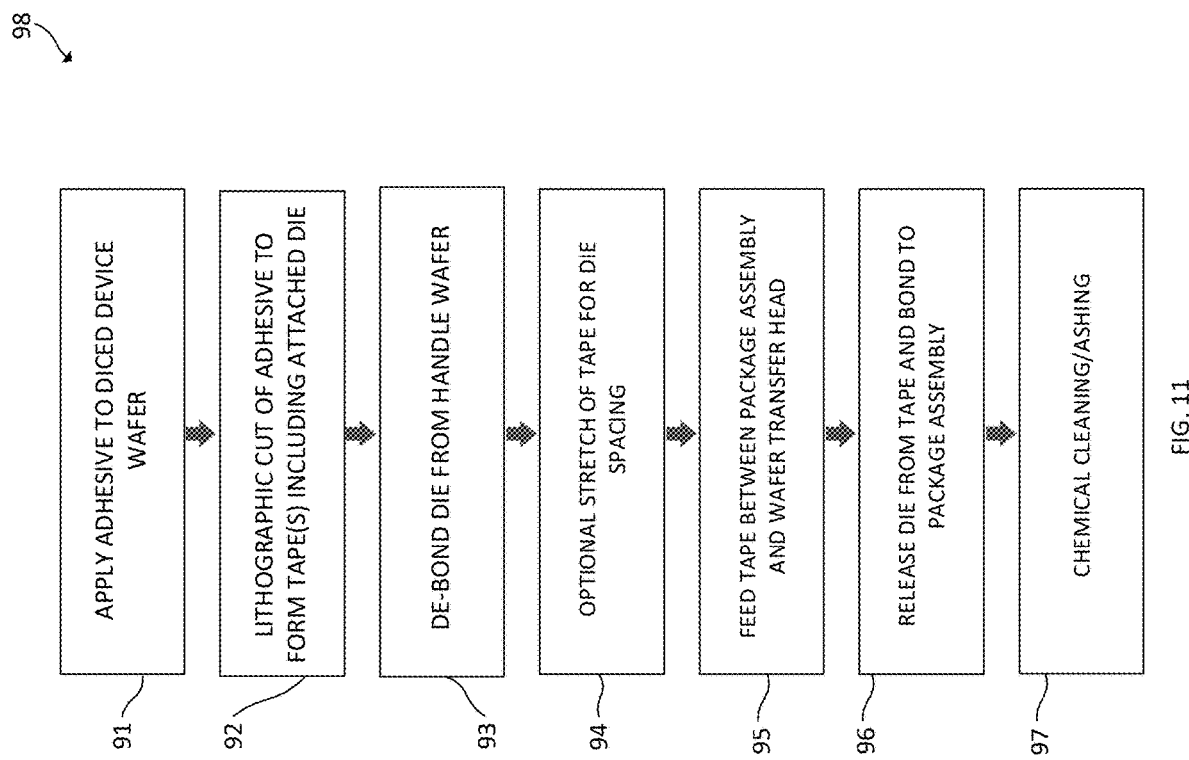
FIG. 11 is a flow diagram showing alternative steps for transferring dies and/or other electrical components to an electronic package assembly using a tape.

The flow diagram provided as FIG. 11 shows a further method 98 wherein adhesive is applied in step 91 to a diced device wafer following steps as described above for obtaining a thinned, diced device wafer bonded to a handle wafer by a release/adhesive layer. The adhesive is cut lithographically on the device wafer in step 92 to obtain one or more adhesive tapes including attached die. The object of the process outlined in FIG. 11 is to obtain a reel to reel tape that provides consistent positioning of dies and/or electronic components after transfer to the tape, stretching the tape if a spacing increase is needed, and locking down the spacing of dies and/or electronic components by attaching the tape to more rigid framing of metal or fiber/composite material to form a layered tape structure. The tape(s) including attached die is straightened once the die are de-bonded from the handle wafer, thus allowing removal of the tape. All of the die can be transferred to the tape in the above process. If die are tested in wafer format or on the tape for known good die (KGD), those die which are not functional can be released from the tape by debonding using a laser or alternate means and discarded. Optionally, replacing defective die or components with known good die includes placing the KGD die or components into the locations where defective die or components were removed from the linear or area array patterns. These KGD replacements for discrete or multiple vacated defective die or components locations using subsequent pick and place methods, structures and equipment, can support integrated systems at high yield. Tape straightening may include winding the tape on a reel that can be employed for roll to roll die placement at high speed. The use of silicone rubber or an alternative adhesive in the method permits straightening of the tape and its attachment to a more rigid thin metal, polymer or composite material to achieve stability after straightening and optional stretching. In this exemplary embodiment, the use of silicone rubber or an alternate adhesive can be attached to a more rigid polymer tape layer or thin metal layer with sequential pressure of a strip of the softer silicone rubber to the higher modulus polymer or metal roll or by means of passing both between a soft roller and/or high modulus roller without damaging the attached die or other electronic elements. In each case a thin adhesive layer is applied to form a bond of the softer silicone rubber or other adhesive with the harder polymer or metal layers. The die are selectively de-bonded from the handle wafer 26 (FIG. 2) in step 93 while remaining attached to the tape. Laser de-bonding may be employed to perform the de-bonding step 93, similar to that shown and described with respect to FIG. 8A.

In some embodiments of the methods 98 or 100 wherein the die are attached to a tape, the tape may be stretchable in order to provide die spacing consistent with the planned die spacing of the substrate (e.g. the package assembly 38) on which the die are to be integrated. The tape may be a monolithic structure made of expandable material. Alternatively, the tape may include a stretchable polymeric material such as polyethylene having an adhesive layer. The polymeric material can be expanded by using air pressure to form a space between each die while maintaining the material within a temperature range that facilitates such expansion. The optional stretching of the tape (e.g. step 94 of method 98) is performed subsequent to de-bonding the die from the handle wafer.

The tape 76 including attached die is fed between a package assembly 38 and a wafer transfer head in step 95, as schematically illustrated in FIG. 8D. The raised regions 36A of the transfer head 34A are aligned with the die 32A attached to the tape, as discussed above with respect to method 100. Unless such raised regions are required, a planar transfer head is preferred for lower cost in both methods 98, 100. Raised areas are used if required for integration of electronic components of different heights for subsequent assembly to systems. Precision wafer transfer heads having recessed areas can sometimes be used for area array or tape assemblies and for use of groups of small electronic elements that can be attached with multiple groups to create systems effectively and cost efficiently. The die 32A are released from the tape in step 96 and bonded to the electronic packages 42 on the package assembly 38. As discussed above, laser ablation of a release layer or push pins can be employed to release die or electronic components from a tape. As further discussed above, additional die and electronic components are bonded directly or indirectly to the package assembly. Cleaning of the package assembly and the transfer head to remove residual adhesive or other material is conducted in step 97.

The techniques disclosed herein facilitate high speed handling of chips and other components. In a relatively simple approach, these electronic elements may be selectively transferred directly to a system such as a package assembly from the planar glass or silicon handle wafers or alternate handle fixtures described above on which the device wafer is thinned. This relatively simple approach can be employed where the end sub-system or system permits element transfer from a planar handle wafer without interference from one or more structures on the end sub-system or system. Raised transfer head regions may be used to address die or component attachment to electronic systems having variable height and/or stacked structures.

Figure 13A:
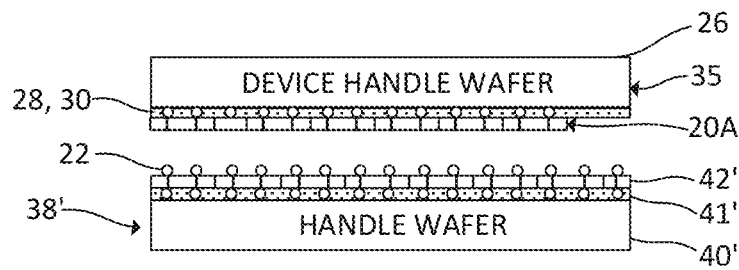
Figure 13B:
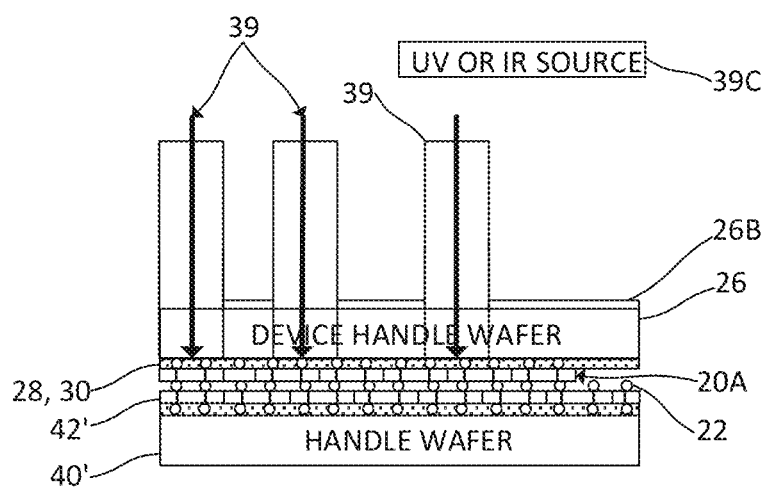
Figure 13C:
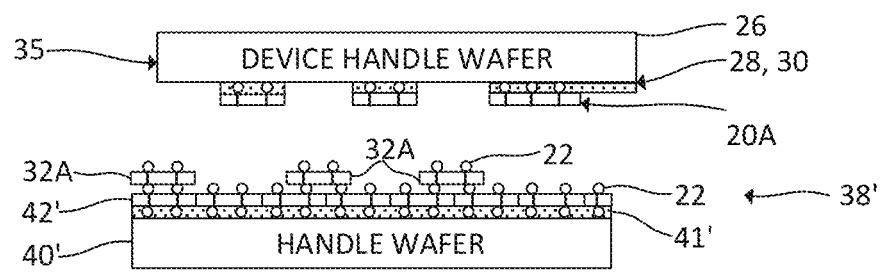

FIGS. 13A-13C show exemplary steps and structures used in the direct transfer of selected electronic elements, for example rows and/or area arrays of such elements, from a handle wafer/device wafer assembly as exemplified by semiconductor structure 35 to an electronic package assembly. Such transfer is effected without the use of a carrier such as a precision wafer transfer head as discussed above or a roll-to-roll flexible tape as discussed later herein. A semiconductor structure 35 including a singulated and possibly thinned device wafer is obtained using, for example, steps as described above with respect to FIGS. 1 and 2. The package assembly 38' includes a handle wafer 40' and electronic packages 42' coupled by a release/adhesive layer 41' therebetween. The bonding sites on the exposed top surface of the package assembly 38' include solder bumps 22. As discussed above, the bonding of electronic elements may be accomplished by bonding sites other than solder bumps. The electronic packages 42' may or may not include a second set of solder bumps on the bottom surfaces thereof.

Referring to FIG. 13A, the handle wafer/device wafer assembly is aligned such that the device wafer 20A is in opposing relation to the top surface of the electronic packages 42' and solder bumps 22 thereon. Alignment fiducials on the handle/device wafer assembly and the electronic package assembly are employed to provide precision alignment of the two structures. (Alignment fiducials (markers) 21A are schematically illustrated in FIG. 4C and are included on a portion of each handle wafer 26, 40' in some embodiments.) A visual alignment detector 21C monitors the alignment fiducials to ensure the die or component locations of the handle wafer/device wafer assembly 35 are precisely aligned with the targeted bonding sites of the opposing electronic package assembly 38'. The targeted plurality of singulated electronic elements (e.g. dies 32A) within the device wafer 20A are accordingly aligned with targeted bonding sites and associated targeted electronic packages 42' of the electronic package assembly 38'. The handle wafer/device wafer assembly is brought into contact with the electronic package assembly 38' such that the device wafer 20A adjoins the bonding sites (solder bumps 22), as shown in FIG. 13B. The alignment fiducials are monitored using a visual system (not shown). Positioning adjustments, if necessary, are made as the structures are moved into engagement.

Electromagnetic radiation 39 is directed through the handle wafer 26 of the handle wafer/device wafer assembly from a source 39C of ultraviolet or infrared radiation once the handle wafer/device wafer assembly is properly aligned and in adjoining relation to the electronic package assembly 38'. A patterned mask 26B is formed on the handle wafer 26 to allow selective passage of the electromagnetic radiation 39 to the portions of the release layer adjoining the targeted electronic elements while blocking transmission to other portions of the release layer. The targeted elements of the device wafer 20A are optionally bonded to the package assembly 38' prior to ablation of the release layer by the electromagnetic radiation. The direct transfer of electronic elements from the device wafer to the package assembly, like the techniques discussed above that employ a carrier such as the PWTH, can support rapid transfer and bonding from small (1-1,000) to large quantities of (hundreds of thousands or millions) of die or electronic components in short periods of time while maintaining high precision of 1 to 2 µm transfer accuracy or possibly higher precision. FIG. 12B illustrates selective ablation of the release layer and bonding of targeted electronic elements to the package assembly 38' at the appropriate bonding sites thereon. The targeted electronic elements to be transferred and the targeted packages 42' are precise, known distances from the alignment fiducials on the handle wafers 26, 40'. The alignment of the alignment fiducials, as detected by the visual detecting system, ensures that the targeted electronic elements are transferred and bonded at the bonding sites to targeted packages 42' while un-targeted electronic elements remain on the handle wafer 26.

Following selective ablation of the release layer causing the selective release of the targeted electronic elements and their selective bonding to the electronic package assembly, the handle wafer/device wafer assembly (semiconductor structure 35) is displaced with respect to the electronic package assembly 38' as schematically illustrated in FIG. 13C. The targeted electronic elements (e.g. die 32A), having been bonded to the targeted packages 42' by reflow of selected solder bumps 22 in accordance with one embodiment, remain with the electronic package assembly 38'. The un-targeted electronic elements of the device wafer 20A remain bonded to the handle wafer 26 following separation of the two structures from each other as reflow is restricted to the regions in which the targeted electrical elements contact the targeted bonding sites. Similar steps can be performed to deposit the remaining elements of the device wafer 20A to additional package assemblies. The package assemblies 42' can be detached from the handle wafer 40' by ablation of the adhesive layer 41' using UV or IR radiation.

Given the discussion thus far, and with reference to the exemplary embodiments, a first method for integrating electronic elements such as chips and components into an electronic package assembly includes obtaining a semiconductor structure including a device wafer comprising an array of singulated electronic elements, a handle wafer, and a release layer, the device wafer being bonded to the handle wafer, and the release layer being positioned between the device wafer and the handle wafer. Such a semiconductor can be obtained by bonding a device wafer (20A or 20B) including an array of electronic elements to a handle wafer 26 using a release layer 28 and an adhesive layer 30. FIG. 1 schematically illustrates the positioning of device and handle wafers prior to bonding. The device wafer is diced on the handle wafer, thereby forming a plurality of singulated electronic elements, for example dies 32A comprising integrated circuits. A carrier such as a precision wafer transfer head or a flexible tape is aligned with the device wafer. Electromagnetic radiation is directed through the handle wafer, thereby causing ablation of discrete, selected portions of the release layer beneath a targeted plurality of the singulated electronic elements. The exemplary method further includes attaching the targeted plurality of singulated electronic elements to the carrier for transfer to an electronic package assembly. The targeted plurality of singulated electronic elements are detached from the carrier for integration into an electronic package assembly. Attachment of the electronic elements to the carrier preferably though not necessarily precedes their detachment by laser ablation from the handle wafer. The exemplary method may further include aligning the targeted plurality of singulated electronic elements attached to the carrier with targeted bonding sites of the electronic package assembly and bonding the targeted plurality of singulated electronic elements to the targeted bonding sites of the electronic package assembly. FIGS. 4A-B and 5 schematically illustrate die transfer using transfer heads 34A, 34B, respectively, as carriers of electronic elements. The singulated electronic elements attached to the precision wafer transfer heads are transferred to the targeted bonding sites by detaching them from the precision wafer transfer head and bonding the singulated electronic elements to the targeted bonding sites of the electronic package assembly. Solder reflow is conducted in some embodiments of the method to bond the electronic elements directly to an electronic package, as illustrated in FIG. 4B, or to bond the electronic elements to other structures integrated to the electronic package assembly, such as shown in FIGS. 5 and 6. In some embodiments, lithographic or other techniques can be employed to fabricate the transfer head(s) so that the electronic elements on raised areas thereof will be aligned with the targeted bonding sites of a targeted array. Lithographic techniques may further be employed to form a patterned mask beneath the handle wafer such that openings in the mask are aligned with the electronic elements of the device wafer to be debonded by ablation of selected portions of the release layer. In embodiments wherein an adhesive layer is deposited on a device wafer to allow attachment of selected electronic elements to a transfer head, the adhesive layer may be patterned to facilitate selective attachment. The adhesive patterning, which provides relatively high regions corresponding to the targeted electronic elements to be selected from the device wafer, allows the attachment of the selected electronic elements to a transfer head having a planar surface. Unselected electronic elements, which have less adhesive or no adhesive thereon, will not contact the transfer head and remain attached to the handle wafer that supports the device wafer as the selected electronic elements are attached to the transfer head.

Embodiments of the exemplary method include the use of flexible, elongate tape such as dicing tape having an adhesive surface as a carrier for obtaining electronic elements from a device wafer and transferring them to an electronic package assembly. The targeted plurality of singulated electronic elements is attached to the adhesive surface of the flexible tape, contacted to an electronic package assembly, detached from the flexible tape, and bonded to targeted bonding sites of the electronic package assembly. FIG. 8D shows the bonding of electronic elements in the form of dies 32A to a package assembly. The flexible tape 76 employed may be wound/unwound on reels as it passes sequentially through a first station (FIGS. 8A-C) configured to cause targeted electronic elements to be transferred from a device wafer to the tape and a second station (FIGS. 8D-E) that is configured to cause the targeted electronic elements carried by the tape to be released from the tape and attached to the electronic package assembly.

A third exemplary method for integrating electronic elements into an electronic package assembly includes obtaining a carrier including a handle and a release layer on a first surface of the handle, attaching a plurality of singulated electronic elements to the carrier such that the release layer is between the electronic elements and the first surface of the handle, and aligning the carrier with an electronic package assembly including bonding sites thereon. Electromagnetic radiation is directed through the handle, thereby causing ablation of discrete, selected portions of the release layer beneath a first targeted plurality of the singulated electronic elements attached to the carrier, such as shown in FIG. 12A. The first targeted plurality of the singulated electronic elements I is incorporated into the electronic package assembly at a targeted plurality of the bonding sites using techniques such as solder reflow.

A further method involves the direct transfer of targeted electronic elements from a device wafer to an electronic package assembly. An exemplary semiconductor structure 35' includes a device wafer comprised of singulated electronic elements such as dies 32A, a handle wafer 26, and a release layer 28 therebetween. The targeted plurality of the singulated electronic elements is aligned with a plurality of targeted bonding sites of an electronic package assembly, such as shown in FIG. 13A. An alignment detector may be employed to facilitate such alignment by monitoring alignment fiducials on the handle wafers 26, 40 or other element of each opposing structure. Electromagnetic radiation is directed through the handle wafer 26, thereby causing ablation of discrete, selected portions of the release layer beneath the targeted plurality of the singulated electronic elements. Ultraviolet or infrared radiation 39 may be used to cause selected ablation for releasing targeted electronic elements from a handle wafer 26. The targeted plurality of singulated electronic elements are bonded to the targeted bonding sites of the electronic package assembly. The handle wafer/device wafer assembly, which includes the unselected electronic elements, is separated from the package assembly after the selected electronic elements 32A are bonded to the targeted bonding sites. The method of claim may further include removing portions of the release layer 28 between the singulated electronic elements prior to causing ablation of the discrete, selected portions of the release layer beneath the targeted plurality of the singulated electronic elements. In one or more embodiments of the method, obtaining the semiconductor structure includes dicing the device wafer 20A on the handle wafer, thereby forming the array of the singulated electronic elements. In some embodiments, bonding the targeted plurality of the singulated electronic elements to the targeted bonding sites of the electronic package assembly is conducted prior to ablation of the discrete, selected portions of the release layer.

A third exemplary method for integrating electronic elements into an electronic package assembly includes obtaining a semiconductor structure including a device wafer comprising an array of singulated electronic elements, a handle wafer, and a release layer, the device wafer being bonded to the handle wafer, and the release layer being positioned between the device wafer and the handle wafer. An adhesive layer is deposited on the device wafer such that the singulated electronic elements are attached to the adhesive layer. The adhesive layer is lithographically cut to form an elongate tape, the tape including the electronic elements attached thereto. Electromagnetic radiation is directed through the handle wafer, thereby causing ablation of discrete, selected portions of the release layer beneath a targeted plurality of the singulated electronic elements or all of the singulated electronic elements. The tape is removed from the device wafer with the targeted plurality of singulated electronic elements attached thereto. The method further includes aligning the targeted plurality of singulated electronic elements attached to the tape with a plurality of targeted bonding sites of an electronic package assembly. The singulated electronic elements attached to the tape are transferred to a plurality of targeted bonding sites by detaching the targeted plurality of singulated electronic elements from the tape and bonding the singulated electronic elements to the targeted bonding sites. Bonding of the electronic elements to the targeted bonding sites preferably precedes detachment thereof from the tape.

Assemblies for integrating electronic elements into an electronic package assembly are also provided in accordance with the teachings herein. One exemplary assembly includes a semiconductor structure such as the handle wafer/device wafer structure 35 as described herein. The semiconductor structure includes one or more first alignment markers, the targeted electronic elements to be transferred being located at selected distances from the one or more first alignment markers. A release layer is positioned between the device wafer and the handle wafer. A carrier assembly includes one or more second alignment markers and selected surface areas configured for attaching the targeted electronic elements, the selected surface areas being configured for alignment with the targeted electronic elements when the one or more first alignment markers are aligned with the one or more second alignment markers. An electromagnetic radiation source is configured to direct electromagnetic radiation through the handle wafer. The handle wafer may be configured to allow ablation of discrete, selected portions of the release layer through the use of a patterned mask thereon. Alternatively, the radiation source is configured to ablate the discrete, selected portions of the release layer to release the targeted electronic elements if the handle wafer is not configured to do so. An electronic package assembly includes one or more third alignment markers and a plurality of targeted bonding sites. The selected surface areas of the carrier assembly are configured for alignment with the targeted bonding sites when the one or more second alignment markers are aligned with the one or more third alignment markers. The carrier assembly includes a precision wafer transfer head including the one or more alignment markers in some embodiments. In other embodiments, the carrier assembly includes a flexible tape and a precision wafer transfer head for urging the tape into contact with the device wafer. The precision wafer transfer head may later be used to urge the tape, including the targeted electronic elements attached to the tape, towards the package assembly, such as shown in FIG. 8D. In some embodiments, the release layer 28 does not extend over the handle wafer between the targeted electronic elements. As discussed above, the portions of the release layer (and distinct adhesive layer, if employed) between the singulated electronic elements may be removed by etching so that the only remaining portions of the release layer above the handle wafer are beneath the singulated electronic elements and not between them.

The above-described embodiments of the invention are intended to be illustrative only. Other embodiments may, for example, utilize different materials and processing steps from those expressly set forth above to achieve embodiments falling within the scope of the invention. These many alternative embodiments will be apparent to one having ordinary skill in the relevant arts.

All the features disclosed herein may be replaced by alternative features serving the same, equivalent, or similar purposes, unless expressly stated otherwise. Thus, unless expressly stated otherwise, each feature disclosed is one example only of a generic series of equivalents. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved. It is to be appreciated that the various layers and/or regions and features shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Any element in a claim that does not explicitly state "means for" performing a specified function or "step for" performing a specified function is not to be interpreted as a "means for" or "step for" clause as specified in AIA 35 U.S.C. § 112(f). In particular, the use of "steps of" in the claims herein is not intended to invoke the provisions of AIA 35 U.S.C. § 112(f).

What is claimed is:

1. A method for integrating electronic elements into an electronic package assembly, comprising:

obtaining a semiconductor structure including a device wafer comprising an array of singulated electronic elements, a handle wafer, and a release layer, the device wafer being bonded to the handle wafer, and the release layer being positioned between the device wafer and the handle wafer;

aligning a carrier with the device wafer, the carrier including a rigid body portion and a plurality of discrete raised regions extending from the rigid body portion, each of the discrete raised regions corresponding to one of a targeted plurality of the singulated electronic elements;

depositing a further release layer on a top surface of the device wafer or on the raised regions of the carrier;

attaching the targeted plurality of singulated electronic elements to the discrete raised regions of the carrier;

subsequent to attaching the targeted plurality of the singulated electronic elements to the discrete raised regions of the carrier and while maintaining attachment of the of the targeted plurality of singulated electronic elements to the discrete raised regions of the carrier, directing electromagnetic radiation through the handle wafer, thereby causing ablation of discrete, selected portions of the release layer beneath the targeted plurality of the singulated electronic elements;

aligning the targeted plurality of singulated electronic elements attached to the carrier with a plurality of targeted bonding sites of an electronic package assembly;

integrating the targeted plurality of singulated electronic elements into the electronic package assembly at the targeted bonding sites, and detaching the targeted plurality of singulated electronic elements from the discrete raised regions of the carrier.

2. The method of claim 1, further including:

removing portions of the release layer between the singulated electronic elements prior to causing ablation of the discrete, selected portions of the release layer beneath the targeted plurality of the singulated electronic elements.

3. The method of claim 1, further including:

bonding the targeted plurality of singulated electronic elements to the carrier using the further release layer prior to causing ablation of the discrete, selected portions of the release layer.

4. The method of claim 1, wherein causing ablation of the discrete, selected portions of the release layer includes subjecting the release layer to radiation in the UV range.

5. The method of claim 1, further wherein detaching the targeted plurality of the singulated electronic elements from the discrete raised regions of the carrier includes ablating the further release layer by directing electromagnetic radiation through the carrier, the frequency of the electromagnetic radiation directed through the carrier being different from the frequency of the electromagnetic radiation directed through the handle wafer.

6. The method of claim 5, wherein depositing the further release layer includes depositing the further release layer on the device wafer and patterning the further release layer on the device wafer to correspond to the targeted plurality of the singulated electronic elements.

7. The method of claim 1, wherein the singulated electronic elements include solder bump arrays, and further wherein integrating the targeted plurality of singulated electronic elements into the electronic package assembly includes reflow of the solder bump arrays, thereby bonding the targeted plurality of the singulated electronic elements to the targeted bonding sites of the electronic package assembly.

8. The method of claim 1, further including forming a patterned mask on the handle wafer including openings aligned with the targeted plurality of the singulated electronic elements and directing the electromagnetic radiation through the openings in the patterned mask.

9. The method of claim 1, wherein directing electromagnetic radiation through the handle wafer includes causing a laser scanning system to sequentially generate electromatic radiation pulses and direct the electromatic radiation energy to areas or spots corresponding to the targeted plurality of the singulated electronic elements, thereby sequentially causing the ablation of the discrete, selected portions of the release layer beneath the targeted plurality of singulated electronic elements.

10. The method of claim 1, wherein obtaining the semiconductor structure includes:
bonding the device wafer to the handle wafer using the release layer and a distinct adhesive layer, the distinct adhesive layer being positioned between the release layer and the device wafer, and
dicing the device wafer on the handle wafer, thereby forming the plurality of the singulated electronic elements.

11. The method of claim 10, further including removing portions of the release layer and the distinct adhesive layer between the singulated electronic elements prior to causing ablation of the discrete, selected portions of the release layer beneath the targeted plurality of the singulated electronic elements.

12. The method of claim 1, wherein the singulated electronic elements include solder bump arrays, and further wherein integrating the targeted plurality of singulated electronic elements into the electronic package assembly includes reflow of the solder bump arrays, thereby bonding the targeted plurality of the singulated electronic elements to the targeted bonding sites of the electronic package assembly.

13. The method of claim 12, wherein bonding the targeted plurality of the singulated electronic elements to the targeted bonding sites is conducted prior to detaching the targeted plurality of singulated electronic elements from the carrier.

14. The method of claim 13, wherein detaching the targeted plurality of the singulated electronic elements from the carrier includes ablating the further release layer by directing electromagnetic radiation through the carrier, the frequency of the electromagnetic radiation directed through the carrier being different from the frequency of the electromagnetic radiation directed through the handle wafer.

15. The method of claim 14, wherein detaching the targeted plurality of the singulated electronic elements from the carrier further includes non-selectively releasing all of the targeted plurality of the singulated electronic elements from the carrier.

16. The method of claim 5, wherein detaching the targeted plurality of the singulated electronic elements from the carrier further includes non-selectively releasing all of the targeted plurality of the singulated electronic elements from the carrier.

17. The method of claim 1, wherein the further release layer is deposited on the raised regions of the carrier.

18. The method of claim 1, wherein obtaining the semiconductor structure includes:
bonding the device wafer to the handle wafer;
thinning the device wafer on the handle wafer; and
dicing the device wafer subsequent to thinning.

19. The method of claim 18, wherein obtaining the semiconductor structure further includes:
depositing an adhesive layer on the release layer or on the device wafer.

20. A method for integrating electronic elements into an electronic package assembly, comprising:
obtaining a semiconductor structure including a device wafer comprising an array of singulated electronic elements, a handle wafer, and a release layer, the device wafer being bonded to the handle wafer, and the release layer being positioned between the device wafer and the handle wafer;
aligning a carrier with the device wafer;
attaching a targeted plurality of singulated electronic elements to the carrier;
subsequent to attaching the targeted plurality of the singulated electronic elements to the carrier, directing electromagnetic radiation through the handle wafer, thereby causing ablation of discrete, selected portions of the release layer beneath the targeted plurality of the singulated electronic elements;
removing portions of the release layer between the singulated electronic elements prior to causing ablation of the discrete, selected portions of the release layer beneath the targeted plurality of the singulated electronic elements;
aligning the targeted plurality of singulated electronic elements attached to the carrier with a plurality of targeted bonding sites of an electronic package assembly;
integrating the targeted plurality of singulated electronic elements into the electronic package assembly at the targeted bonding sites, and
detaching the targeted plurality of singulated electronic elements from the carrier.

* * * * *